(12) United States Patent
Chen et al.

(10) Patent No.: US 11,167,984 B2
(45) Date of Patent: Nov. 9, 2021

(54) NANO-ELECTROMECHANICAL SYSTEM (NEMS) DEVICE STRUCTURE AND METHOD FOR FORMING THE SAME

(71) Applicant: TAIWAN SEMICONDUCTOR MANUFACTURING CO., LTD., Hsinchu (TW)

(72) Inventors: Hsin-Ping Chen, Hsinchu County (TW); Carlos H. Diaz, Mountain View, CA (US); Ken-Ichi Goto, Hsinchu (TW); Shau-Lin Shue, Hsinchu (TW); Tai-I Yang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/895,446

(22) Filed: Jun. 8, 2020

(65) Prior Publication Data

US 2020/0299129 A1 Sep. 24, 2020

Related U.S. Application Data

(62) Division of application No. 16/009,668, filed on Jun. 15, 2018, now Pat. No. 10,676,351, which is a division of application No. 15/007,852, filed on Jan. 27, 2016, now Pat. No. 10,000,373.

(51) Int. Cl.
| | |
|---|---|
| H04R 23/00 | (2006.01) |
| B82B 1/00 | (2006.01) |
| B81C 1/00 | (2006.01) |
| B81B 3/00 | (2006.01) |
| B82B 3/00 | (2006.01) |

(52) U.S. Cl.
CPC ............ *B82B 1/005* (2013.01); *B81B 3/0021* (2013.01); *B81C 1/00246* (2013.01);
(Continued)

(58) Field of Classification Search
CPC ..... B82B 1/005; B82B 3/008; B81C 1/00246; B81C 2203/0771; B81C 2203/0136;
(Continued)

(56) References Cited

U.S. PATENT DOCUMENTS

| | | |
|---|---|---|
| 5,919,548 A | 7/1999 | Barron et al. |
| 9,449,872 B1 | 9/2016 | Lei et al. |

(Continued)

*Primary Examiner* — Mohammad M Hoque
(74) *Attorney, Agent, or Firm* — Birch, Stewart, Kolasch & Birch, LLP

(57) ABSTRACT

A NEMS device structure and a method for forming the same are provided. The NEMS device structure includes a first dielectric layer formed over a substrate, and a first conductive layer formed in the first dielectric layer. The NEMS device structure includes a second dielectric layer formed over the first dielectric layer, and a first supporting electrode a second supporting electrode and a beam structure formed in the second dielectric layer. The beam structure is formed between the first supporting electrode and the second supporting electrode, and the beam structure has a T-shaped structure. The NEMS device structure includes a first through hole formed between the first supporting electrode and the beam structure, and a second through hole formed between the second supporting electrode and the beam structure.

20 Claims, 23 Drawing Sheets

(52) U.S. Cl.
CPC ....... *B82B 3/008* (2013.01); *B81B 2203/0118* (2013.01); *B81B 2207/015* (2013.01); *B81B 2207/09* (2013.01); *B81C 2203/0136* (2013.01); *B81C 2203/0771* (2013.01)

(58) Field of Classification Search
CPC ............ B81B 3/0021; B81B 2207/015; B81B 2203/0118; B81B 2207/09; H01L 23/481
USPC .......................................................... 257/98
See application file for complete search history.

(56) References Cited

U.S. PATENT DOCUMENTS

| | | |
|---|---|---|
| 2003/0210124 A1 | 11/2003 | Volant et al. |
| 2004/0126921 A1* | 7/2004 | Volant ................ H01H 59/0009 438/52 |
| 2006/0033179 A1 | 2/2006 | Tsai et al. |
| 2009/0146227 A1 | 6/2009 | Igarashi |
| 2009/0267166 A1 | 10/2009 | Verheijden et al. |
| 2012/0181638 A1 | 7/2012 | Renault et al. |
| 2013/0015743 A1 | 1/2013 | Tsai et al. |
| 2013/0105921 A1* | 5/2013 | Najafi .................. G01C 19/574 257/415 |
| 2013/0126989 A1 | 5/2013 | Lin et al. |
| 2013/0285166 A1 | 10/2013 | Classen |
| 2014/0000377 A1 | 1/2014 | Lin et al. |
| 2014/0206123 A1 | 7/2014 | Chu et al. |
| 2014/0264474 A1* | 9/2014 | Chu .................... B81C 1/00238 257/254 |
| 2014/0264744 A1* | 9/2014 | Chu .................... H01L 41/1138 257/532 |
| 2014/0338459 A1 | 11/2014 | Besling et al. |
| 2015/0360936 A1 | 12/2015 | Tayebi et al. |
| 2016/0187370 A1 | 6/2016 | Ikehashi |
| 2017/0053764 A1 | 2/2017 | Mori et al. |

\* cited by examiner

ND-ELECTROMECHANICAL SYSTEM (NEMS) DEVICE STRUCTURE AND METHOD FOR FORMING THE SAME

CROSS REFERENCE TO RELATED APPLICATIONS

This application is a Divisional application of U.S. patent application Ser. No. 16/009,668, filed on Jun. 15, 2018, which is a Divisional application of U.S. patent application Ser. No. 15/007,852, filed on Jan. 27, 2016, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Nano-electro mechanical system (NEMS) devices have recently been developed. NEMS devices include devices fabricated using semiconductor technology to form mechanical and electrical features. Examples of the NEMS devices include gears, levers, valves, and hinges. The NEMS devices are implemented in accelerometers, pressure sensors, microphones, actuators, mirrors, heaters, and/or printer nozzles.

Although existing NEMS device structures and methods of fabricating the same have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3E' shows a perspective view of the conductive layers of FIG. 3E, in accordance with some embodiments of the disclosure.

DETAILED DESCRIPTION

Figure 1A:
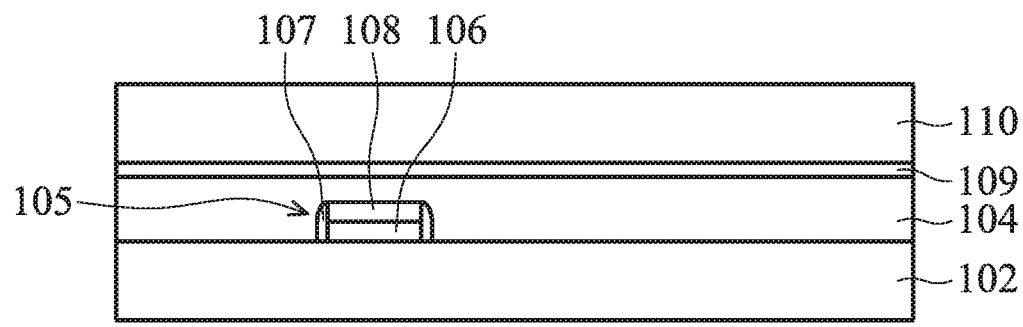
FIGS. 1A-1Q show cross-sectional representations of various stages of forming a NEMS device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a nano-electromechanical system (NEMS) device structure and method for forming the same are provided. The NEMS device structure performs electrical and mechanical function on the nanoscale. FIGS. 1A-1Q show cross-sectional representations of various stages of forming a NEMS device structure 100a, in accordance with some embodiments of the disclosure.

Referring to FIG. 1A, a substrate 102 is provided. The substrate 102 may be made of silicon or other semiconductor materials. In some embodiments, the substrate 102 is a silicon wafer. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

An inter-layer dielectric (ILD) layer 104 is formed over the substrate 102. In some embodiments, the ILD layer 104 is made of silicon oxide (SiOx), silicon nitride (SixNy), silicon oxynitride (SiON) or another applicable material.

The device element 105 is formed in the ILD layer 104. The device element 105 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. In some embodiments, the device element 105 includes a gate dielectric layer 106 and a gate electrode 108, and gate spacers 107 are formed on opposite sidewalls of the gate electrode 108.

In some embodiments, device element 105 is formed in the substrate 102 in a front-end-of-line (FEOL) process. Various processes are performed to form device elements 105, such as deposition, etching, implantation, photolithography, annealing, and/or other applicable processes.

The substrate 102 may include various doped regions such as p-type wells or n-type wells). Doped regions may be doped with p-type dopants, such as boron or $BF_2$, and/or n-type dopants, such as phosphorus (P) or arsenic (As). The doped regions may be formed directly on the substrate 102, in a P-well structure, in an N-well structure, or in a dual-well structure.

The substrate 102 may further include isolation features (not shown), such as shallow trench isolation (STI) features or local oxidation of silicon (LOCOS) features. Isolation features may define and isolate various device elements.

A first etching stop layer 109 is formed over the ILD layer 104, and a first dielectric layer 110 is formed over the first etching stop layer 109. The first etching stop layer 109 is made of a material having a different etch selectivity from the first dielectric layer 110. In some embodiments, the first etching stop layer 109 is made of nitride layer, such as silicon nitride. In some embodiments, the first dielectric layer 110 is an inter-metal dielectric (IMD) layer. In some embodiments, the first dielectric layer 110 is a single layer or multiple layers. The first dielectric layer 110 is made of silicon oxide (SiOx), silicon nitride (SixNy), silicon oxynitride (SiON), dielectric material(s) with low dielectric constant (low-k), or combinations thereof. In some embodiments, the first dielectric layer 110 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the first dielectric layer 110 is deposited by a plasma enhanced chemical vapor deposition (PECVD) process or by a spin coating process.

Figure 1B:
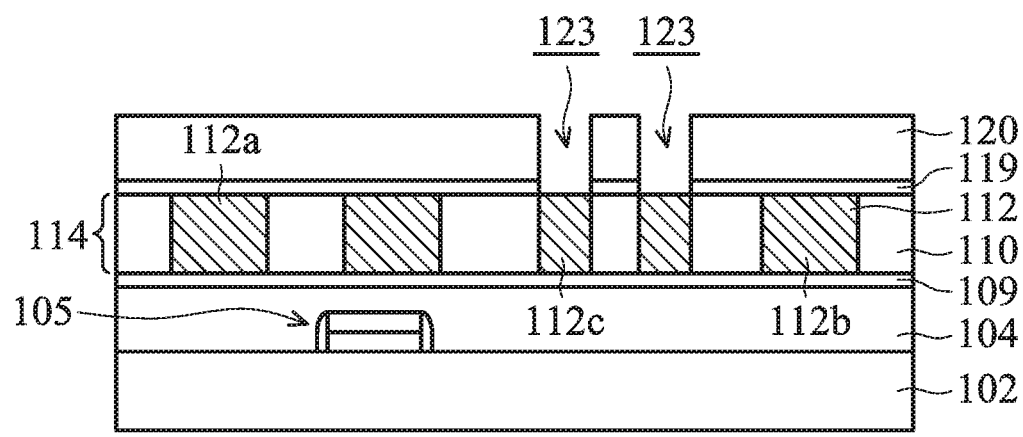
FIG. 1J' shows a top-sectional representation of the fourth conductive layer, in accordance with some embodiments of the disclosure.

Afterwards, a first conductive layer 112 is formed in the first dielectric layer 110, as shown in FIG. 1B, in accordance with some embodiments of the disclosure. The conductive layer 112 is electrically connected to the device element 105 through various metallic lines and vias in the first dielectric layer 110.

An interconnect structure 114 is constructed by the first dielectric layer 110 and the first conductive layer 112. The first dielectric layer 110 and the first conductive layer 112 are formed in a back-end-of-line (BEOL) process. The first conductive layer 112 is made of copper (Cu), copper alloy, aluminum (Al), aluminum alloy, tungsten (W), tungsten alloy, titanium (Ti), titanium alloy, tantalum (Ta) or tantalum alloy. In some embodiments, the first conductive layer 112 is formed by a plating method, electroless plating, sputtering or chemical vapor deposition (CVD).

The first conductive layer 112 includes a number of portions. In some embodiments, the first conductive layer 112 includes a first portion 112a, a second portion 112b and a third portion 112c between the first portion 112a and the second portion 112b.

Afterwards, a second etching stop layer 119 is formed over the first dielectric layer 110, and a second dielectric layer 120 is formed over the second etching stop layer 119. In some embodiments, the second dielectric layer 120 is also an inter-metal dielectric (IMD) layer. In some embodiments, the first dielectric layer 110 and the second dielectric layer 120 are made of the same materials.

Afterwards, a trench (or via) 123 is formed in the second dielectric layer 120 to expose a portion of the first conductive layer 112. The trench (or via) 123 is formed by a patterning process. The patterning process includes a photolithography process and an etching process. Examples of a photolithography process include soft baking, mask aligning, exposure, post-exposure baking, developing the photoresist, rinsing and drying (e.g., hard baking). The etching process may be a dry etching or a wet etching process.

Figure 1C:
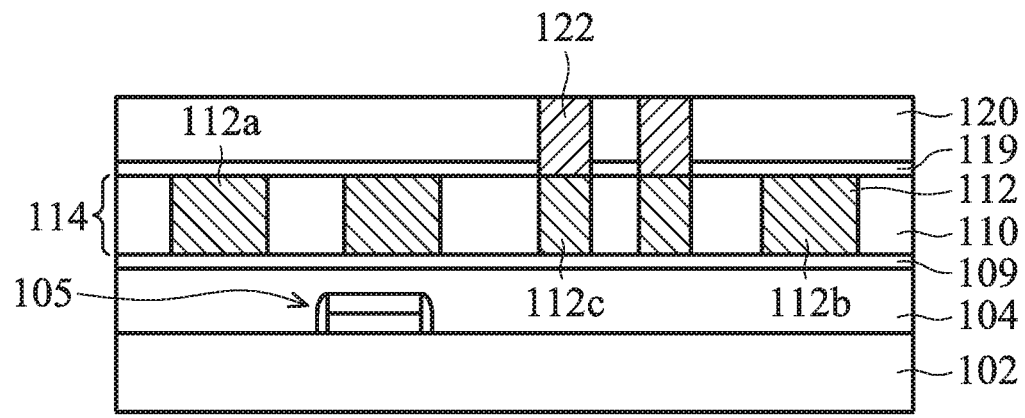

After the trench 123 (or via) is formed, a second conductive layer 122 is formed in the trench (or via) 123, as shown in FIG. 1C, in accordance with some embodiments of the disclosure. The second conductive layer 122 is electrically connected to a portion of the first conductive layer 112. In some embodiments, the second conductive layer 122 is electrically connected to the third portion 112c of the second conductive layer 112.

The second conductive layer 122 is made of conductive materials. In some embodiments, the second conductive layer 122 is made of doped silicon (Si), copper (Cu), copper alloy, aluminum (Al), aluminum alloy, tungsten (W), tungsten alloy, titanium (Ti), titanium alloy, tantalum (Ta) or tantalum alloy. In some embodiments, the second conductive layer 114 is formed by a plating method, electroless plating, sputtering or chemical vapor deposition (CVD).

Figure 1D:
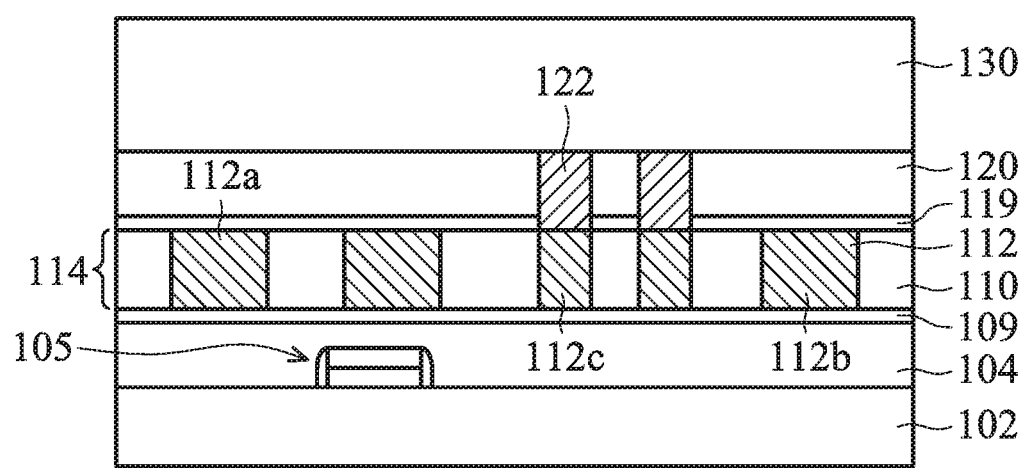

Afterwards, a first sacrificial layer 130 is formed over the second dielectric layer 120, as shown in FIG. 1D, in accordance with some embodiments of the disclosure. The first sacrificial layer 130 is made of insulating material. In some embodiments, the first sacrificial layer 130 is made of silicon oxide ($SiO_2$). In some embodiments, the first sacrificial layer 130 is formed by a deposition process, such as a plasma enhanced chemical vapor deposition (PECVD) process or by a spin coating process.

Figure 1E:
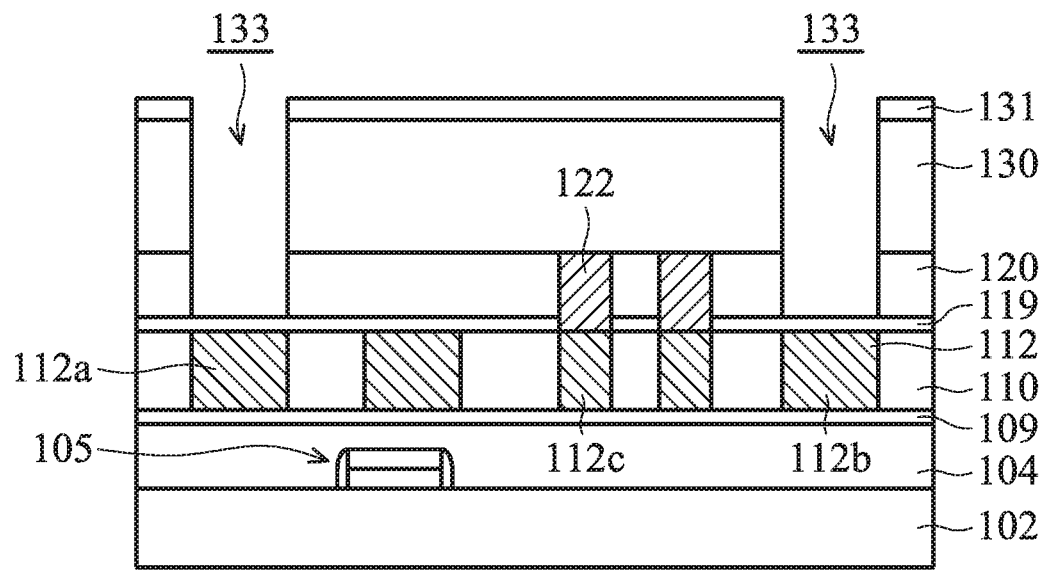

Afterwards, a hard mask layer 131 is formed over the first sacrificial layer 130, as shown in FIG. 1E, in accordance with some embodiments of the disclosure. The hard mask layer 131 is then patterned to form a patterned hard mask layer 131. The first sacrificial layer 130 is etched by using the patterned hard mask layer 131 as a mask. Therefore, a number of first trenches 133 are formed through the first sacrificial layer 130 and through the second dielectric layer 120. The first trenches 133 stop at the second etching stop layer 119. The number of first trenches 133 should be greater than two, in order to form two supporting electrodes (formed later).

Figure 1F:
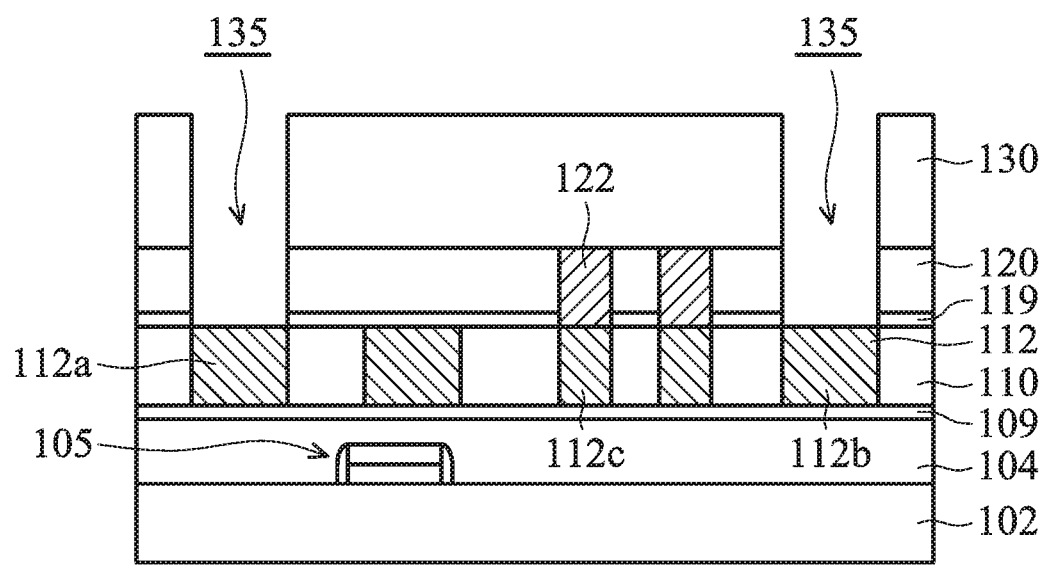

Afterwards, the second etching stop layer 119 is etched to form the second trenches (or vias) 135, as shown in FIG. 1F, in accordance with some embodiments of the disclosure. As a result, the first portion 112a and the second portion 112b are exposed by the second trenches (or vias) 135.

Figure 1G:
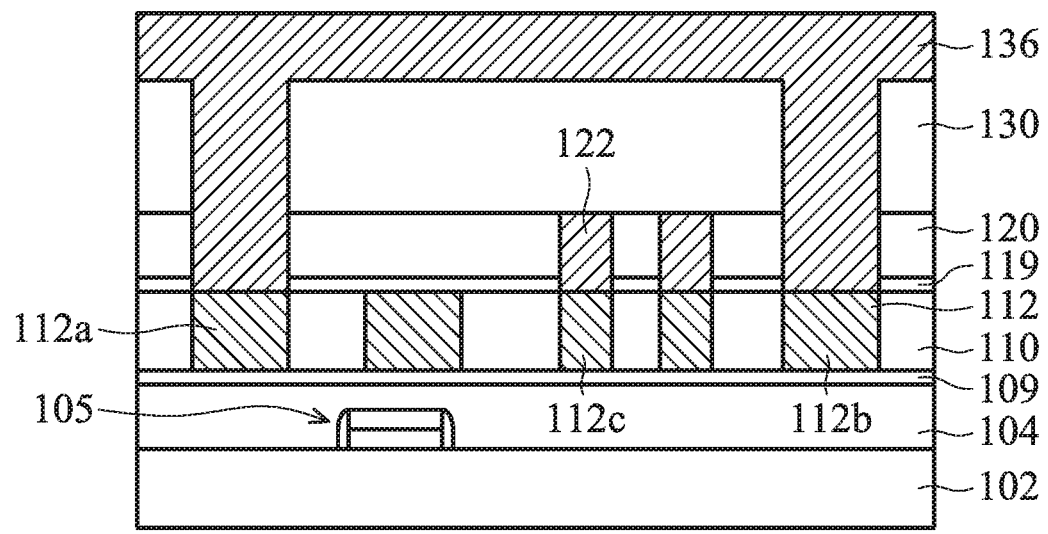

Afterwards, a third conductive layer 136 is formed in the second trenches (or vias) 135 and over the first sacrificial layer 130, as shown in FIG. 1G, in accordance with some embodiments of the disclosure. The third conductive layer 136 is electrically connected to a portion of the first conductive layer 112. In some embodiments, the third conductive layer 136 is electrically connected the first portion 112a and the second portion 112b of the first conductive layer 112. The third conductive layer 136 passes through the second dielectric layer 120 and the third dielectric layer 130.

In some embodiments, the third conductive layer 136 is made of doped silicon (Si), copper (Cu), copper alloy, aluminum (Al), aluminum alloy, tungsten (W), tungsten alloy, titanium (Ti), titanium alloy, tantalum (Ta) or tantalum alloy. In some embodiments, the third conductive layer 136 is formed by a plating method, electroless plating, sputtering or chemical vapor deposition (CVD).

Afterwards, a polishing process is performed on the third conductive layer 136 to remove the excess of the third conductive layer 136. In some embodiments, the polishing process is a chemical mechanical polishing (CMP) process. As a result, a top surface of the third conductive layer 136 is leveled with a top surface of the first sacrificial layer 130.

The third conductive layer 136 includes a first portion 136a and a second portion 136b. The first portion 136a of the third conductive layer 136 is electrically connected to the first portion 112a of the first conductive layer 112, and the second portion 136b of the third conductive layer 136 is electrically connected to the second portion 112b of the first conductive layer 112.

Figure 1H:
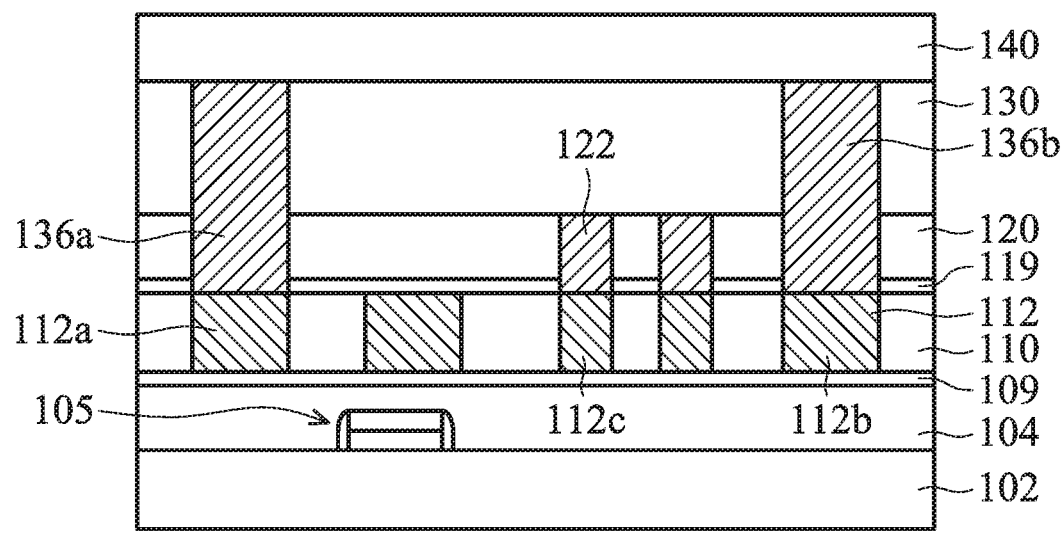

Afterwards, a second sacrificial layer 140 is formed over the first sacrificial layer 130, as shown in FIG. 1H, in accordance with some embodiments of the disclosure. In some embodiments, the second sacrificial layer 140 and the first sacrificial layer 130 are made of the same materials.

Figure 1I:
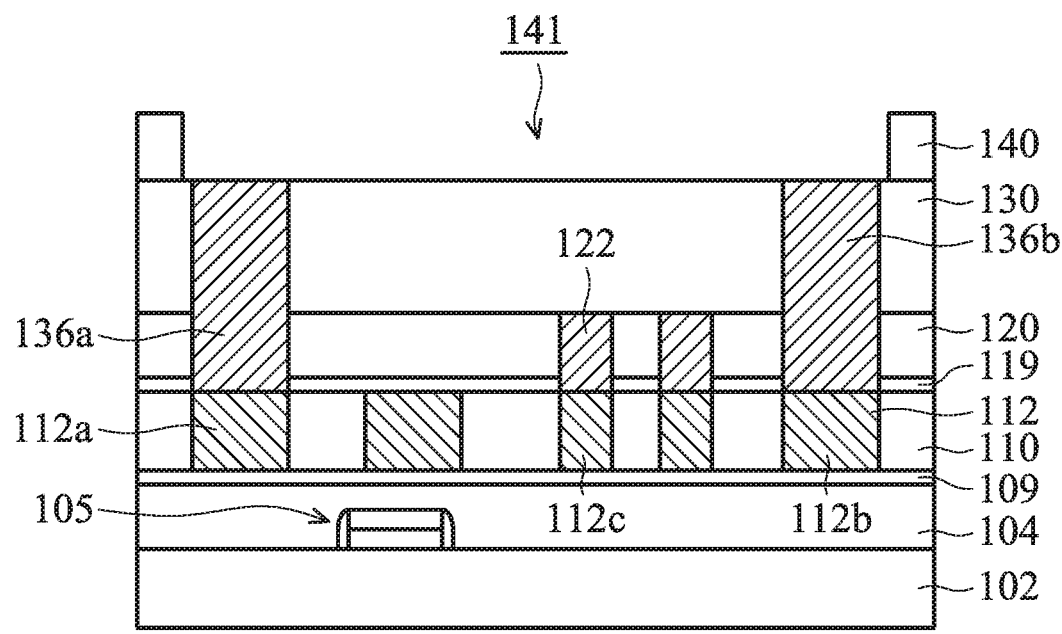

Afterwards, the second sacrificial layer 140 is patterned to form a recess 141 in the second sacrificial layer 140, as shown in FIG. 1I, in accordance with some embodiments of the disclosure. Therefore, a portion of the first sacrificial layer 130 is exposed. A top surface of the first portion 136a of the third conductive layer 136 and a top surface of the second portion 136b of the third conductive layer 136 are exposed.

Figure 1J:
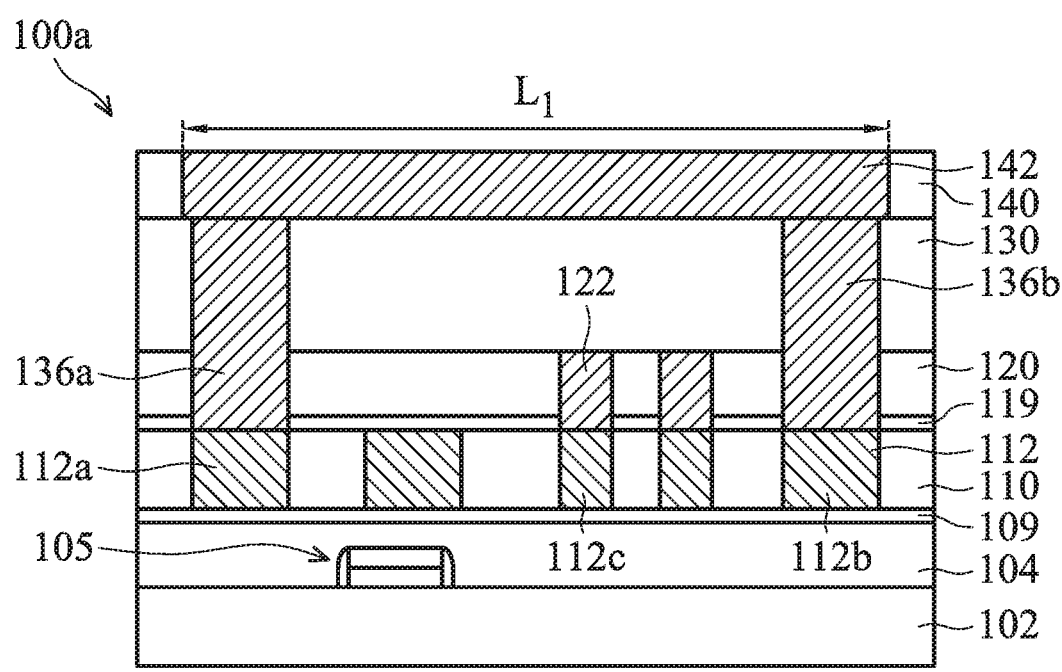
Figure 1J:
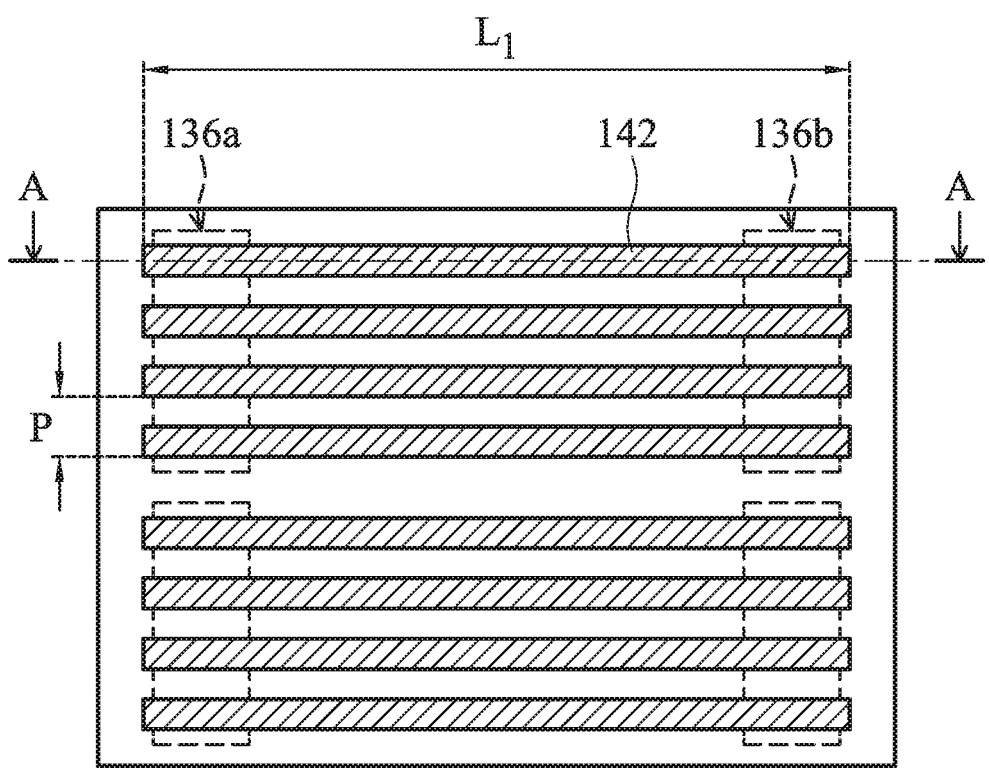

Afterwards, a fourth conductive layer 142 is formed in the recess 141 and over the first sacrificial layer 130, as shown in FIG. 1J, in accordance with some embodiments of the disclosure. Afterwards, a portion of the fourth conductive layer 142 is removed by a polishing process. As a result, a top surface of the fourth conductive layer 142 is leveled with a top surface of the second sacrificial layer 140.

The fourth conductive layer 142 is electrically connected to the first portion 136a and the second portion 136b of the third conductive layer 136. The first portion 136a, the second portion 136b and the fourth conductive layer 142 construct a nano-electromechanical system (NEMS) device structure 100a. In some embodiments, the first portion 136a of the third conductive layer 136 is configured as a first supporting electrode, the second portion 136b is configured as a second supporting electrode, and the fourth conductive layer 142 is configured as a beam structure of the NEMS device structure 100a. In other words, the beam structure of the NEMS device structure 100a includes a first end and a second end, the first end is electrically connected to the first supporting electrode, and the second end is electrically connected to the second supporting electrode.

The fourth conductive layer 142 has a length $L_1$. In some embodiments, the length $L_1$ is referred to as the beam length. In some embodiments, the length $L_1$ is in a range from about 700 nm to about 3100 nm. The operation voltage (or pull-in voltage) depends on the length $L_1$, the width of the fourth conductive layer 142 and gap between conductive layer 142 and conductive layer 122. When the length $L_1$ is within the above-mentioned range, the operation voltage may be relatively lower.

FIG. 1J' shows a top-sectional representation of the fourth conductive layer 142, in accordance with some embodiments of the disclosure. FIG. 1J is a cross-sectional representation of the fourth conductive layer 142 along the line AA' of FIG. 1J'. The rectangular dashed line means the shapes of the first portion 136a and the second portion 136b of the third conductive layer 136 which are below the fourth conductive layer 142.

As shown in FIG. 1J', the fourth conductive layer 142 includes a number of strip structures. Compared with a fourth conductive layer made of one strip structure, the plurality of the strip structures is configured to reduce the resistance of the NEMS device structure. More specifically, the strip structures are arranged in parallel, and therefore the resistance of the fourth conductive layer 142 is reduced.

A pitch P is formed between two adjacent strip structures of the fourth conductive layer 142. In some embodiments, the pitch P is in a range from about 20 nm to about 42 nm. When the pitch P is within above-mentioned range, the resistance of the NEMS device structure may meet requirements. The pitch is depending on what device to replace to meet area saving requirements.

The NEMS is forming in BEOL and is intended to replace FEOL device structures. This means the area saving is from releasing some FEOL devices and constructs same functional devices by NEMs in BEOL.

Figure 1K:
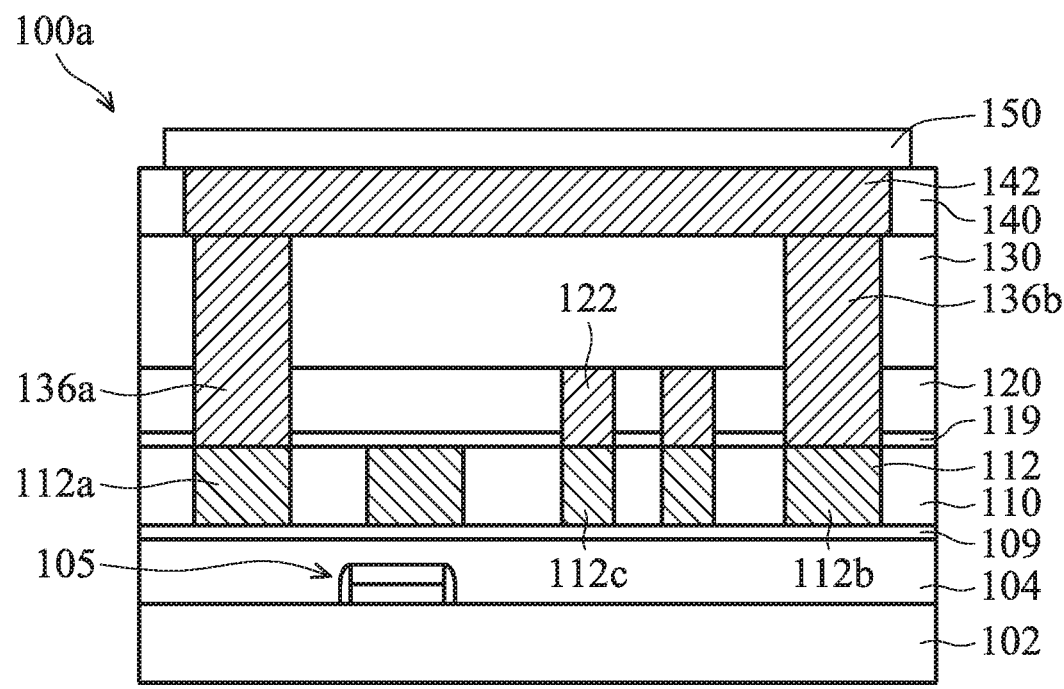

After the fourth conductive layer 142 is formed, a third sacrificial layer 150 is formed over the second sacrificial layer 140 and the fourth conductive layer 142, as shown in FIG. 1K, in accordance with some embodiments of the disclosure. In some embodiments, the third sacrificial layer 150 and the second sacrificial layer 140 are made of the same materials.

Figure 1L:
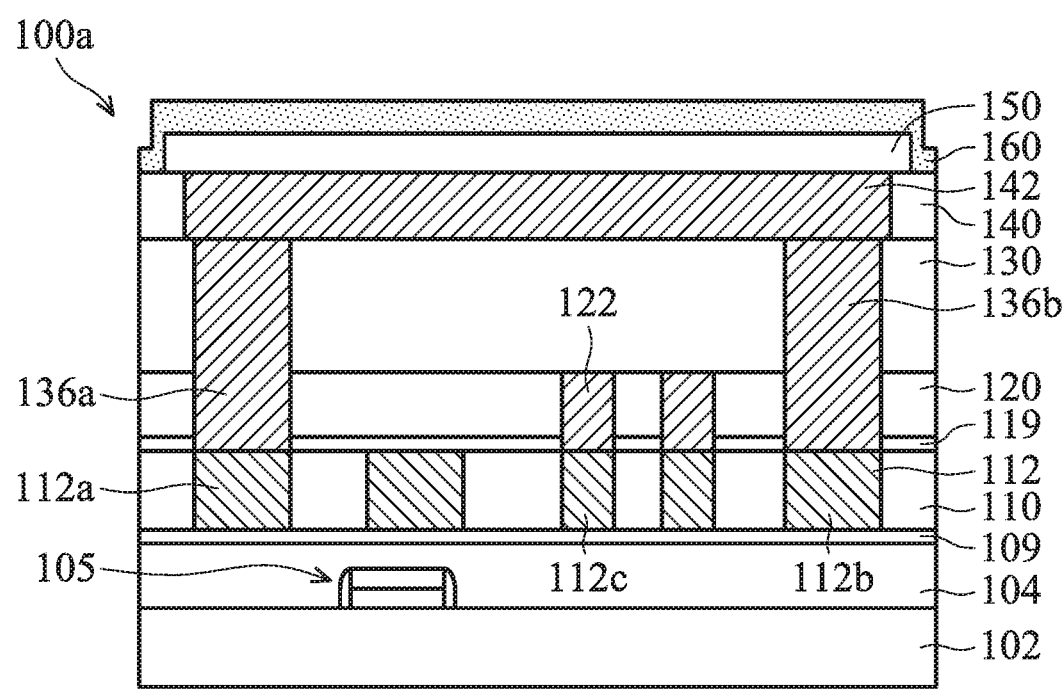

After the third sacrificial layer 150 is formed, a cap structure 160 is formed over the third sacrificial layer 150, as shown in FIG. 1L, in accordance with some embodiments of the disclosure. More specifically, the cap structure 160 is formed on the NEMS device structure 100a for the formation of an encapsulating shell of the NEMS device structure 100a. In some embodiments, the cap structure 160 is made of, nitride, silicon carbide or a combination thereof. In some embodiments, the cap structure 160 is made of silicon nitride, silicon carbide, or another applicable material.

Figure 1M:
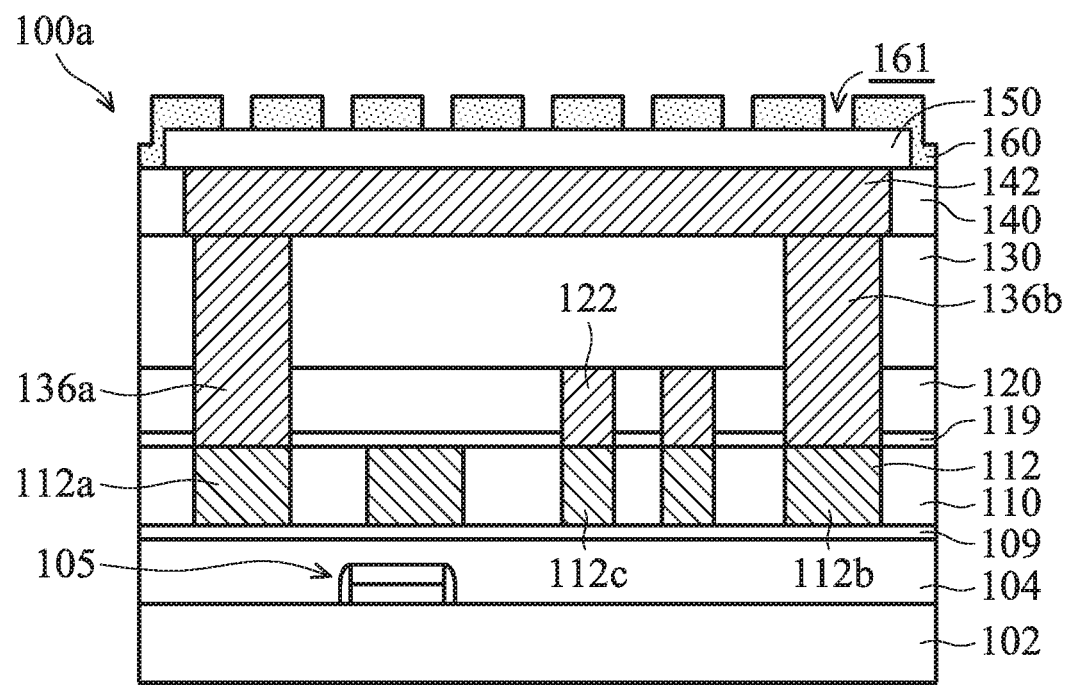

After the cap structure 160 is formed, a number of release holes 161 are formed in the cap structure 160, as shown in FIG. 1M, in accordance with some embodiments of the disclosure. In some embodiments, the release holes 161 are formed by a patterning process including a photolithography process and an etching process.

Figure 1N:
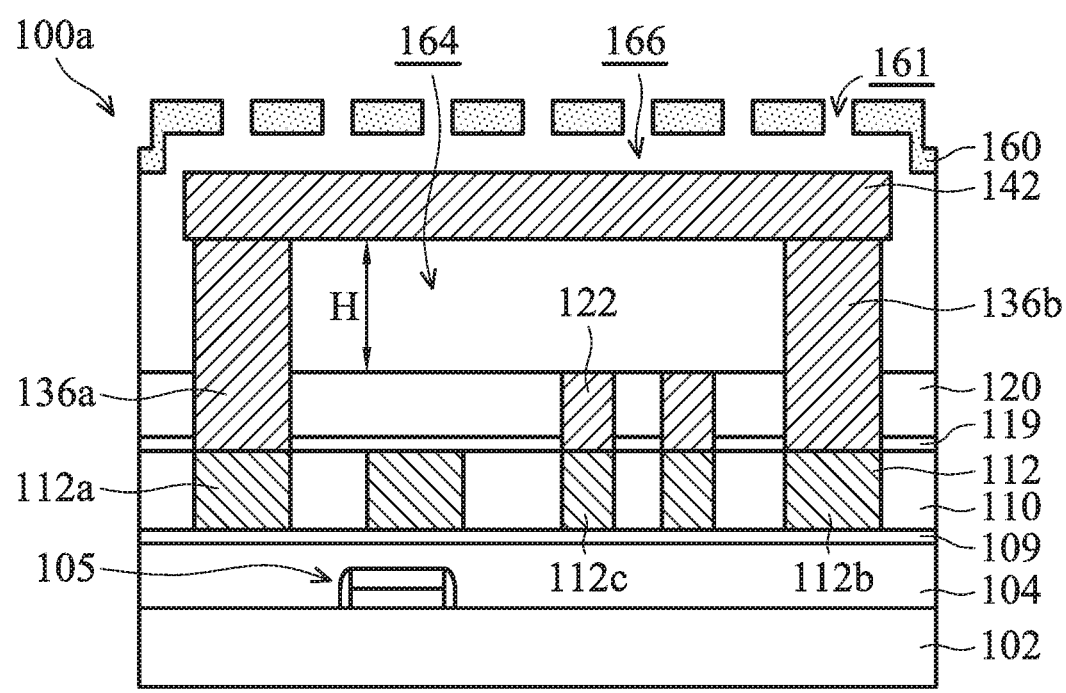

After the release holes 161 are formed, the first sacrificial layer 130, the second sacrificial layer 140 and the third sacrificial layer 150 are removed, as shown in FIG. 1N, in accordance with some embodiments of the disclosure. Therefore, a first cavity 164 is formed between the fourth conductive layer 142, the first portion 136a of the third conductive layer 136 and the second portion 136b of the third conductive layer 136. In addition, a second cavity 146 is formed between the fourth conductive layer 142 and the cap structure 160. The first cavity 164 and the second cavity 166 are connected to each other.

The first sacrificial layer 130, the second sacrificial layer 140 and the third sacrificial layer 150 are removed by an etching process, such as a wet process or dry process. In some embodiments, the sacrificial layers 130, 140, 150 are removed by a liquid hydrogen-fluoride (HF) solution or a vapor HF. In some embodiments, the first sacrificial layer 130, the second sacrificial layer 140 and the third sacrificial layer 150 are made of the same materials, and these layers may be removed in the same etching process. Therefore, the fabrication operation is easy, and the fabrication time is saved.

After the etching process, the fourth conductive layer 142 becomes movable and is configured as a beam structure. The first portion 136a of the third conductive layer 136 and the second portion 136b of the third conductive layer 136 are used as an anchor to fix the fourth conductive layer 142. The second conductive layer 122 which is formed on the third portion 112c of the first conductive layer 112 is used as a sensing electrode. The beam structure (e.g. fourth conductive layer 142) moves up and down when the NEMS device structure 100a is operated, relative to the sensing electrode (e.g. the second conductive layer 122) that senses the movement of the fourth conductive layer 142. Compared with the NEMS device structure with one anchor, the NEMS device structure of this embodiment has two anchors on both sides for supporting the beam structure, and therefore reliability of devices involving relative motion of the beam structure can be enhanced.

As shown in FIG. 1N, a gap H is defined between a top surface of the second dielectric layer 120 and a bottom surface of the fourth conductive layer 142. Because the gap height H can vary with BEOL interconnect pitch scaling (in tens of nm range), the operation voltage (or pull-in voltage which is depends on the gap height) can be relatively lower. In some embodiments, the gap height H is in a range from about 20 nm to about 300 nm. The operation voltage (or pull-in voltage) depends on the gap height H. When the gap height H is within the above-mentioned range, the operation voltage is relatively lower.

Figure 1O:
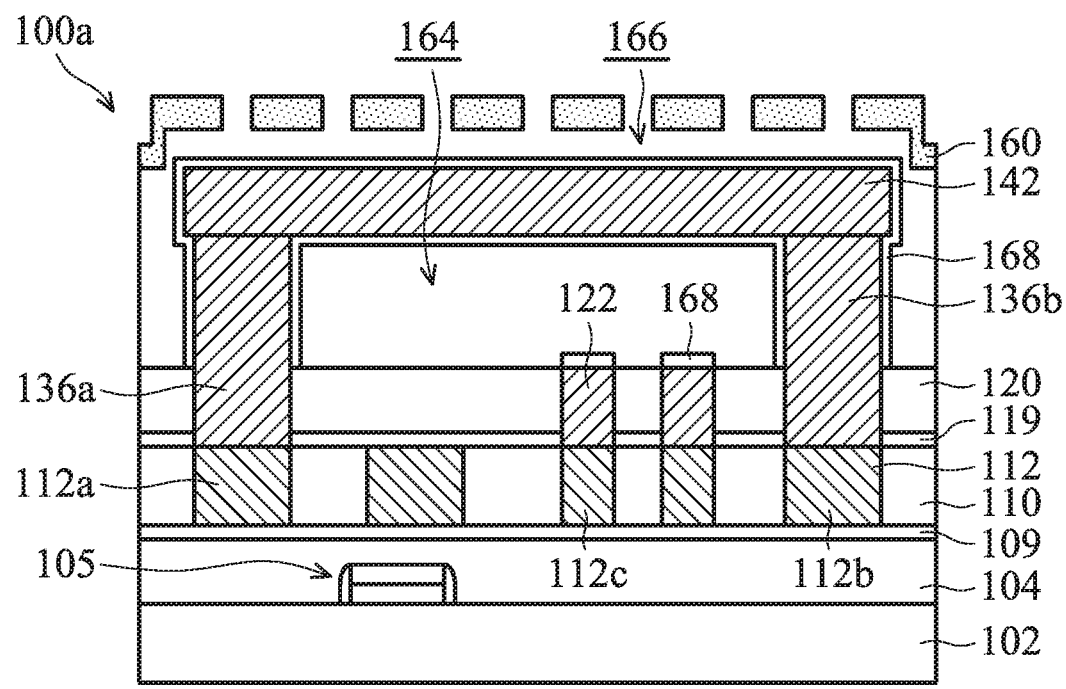

After the NEMS device structure 100a is released, a thin film layer 168 is formed over the NEMS device structure 100a, as shown in FIG. 1O, in accordance with some embodiments of the disclosure. The fourth conductive layer 142, the first portion 136a and the second portion 136b of the third conductive layer 136 are covered by the thin film layer 168. In addition, the thin film layer 168 is formed over the second conductive layer 122.

The thin film layer 168 is applied to improve the reliability of the NEMS device structure 100a. The thin film layer 168 is made of high hardness materials. In some embodiments, the thin film layer 168 is made of cobalt (Co), tungsten (W), or titanium oxide ($TiO_2$) or a combination thereof. In some other embodiments, no the thin film layer 168 is formed over the NEMS device structure 100a. In some embodiments, the thin film layer 168 is formed by an electro-less process.

Figure 1P:
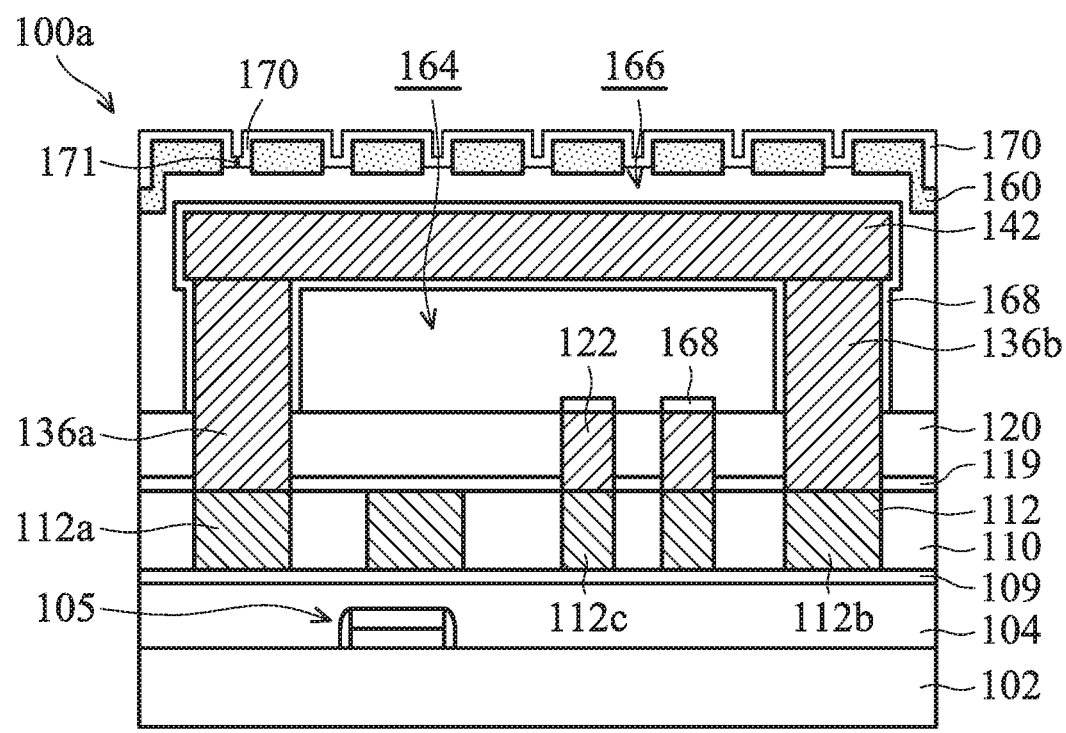
Figure 1Q:
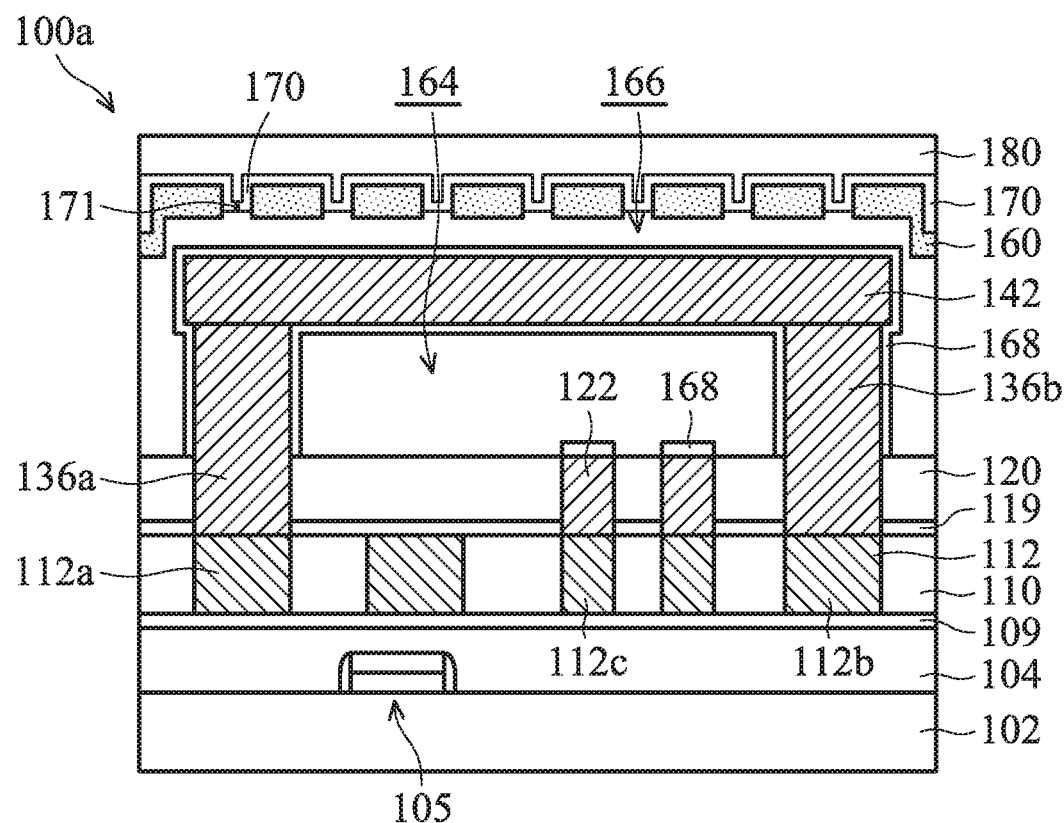

Afterwards, a first passivation layer 170 is formed in the release holes 161 and over the cap structure 160, as shown in FIG. 1P, in accordance with some embodiments of the disclosure. More specifically, the first passivation layer 170 is conformally formed on the cap structure 160. The first passivation layer 170 is configured to seal the release holes 161.

In some embodiments, the first passivation layer 170 is made of insulating material, such as silicon oxide or silicon nitride. In some embodiments, the first passivation layer 170 is formed by a deposition process, such as chemical vapor deposition, spin-on process or another applicable process.

In some embodiments, an air gap 171 is formed in the release holes 161 during the formation of the first passivation layer 170. The air-gap 170 is simultaneously based on the process used for passivation layer 170. The formation of the air gap 171 is comparable to the following processes.

After the first passivation layer 170 is formed, a second passivation layer 180 is formed over the first passivation layer 170, as shown in FIG. 1Q, in accordance with some embodiments of the disclosure. The second passivation layer 180 provides a substantially planar surface. In some embodiments, the second passivation layer 180 is made of insulating material, such as silicon oxide or silicon nitride.

The fabrication operations shown in FIGS. 1A-1Q for forming the NEMS device structure 100a are integrated with the interconnect structure flow at the BEOL. Therefore, there are more areas which are located below the NEMS device structure 100a for forming the logic devices. In addition, the beam structure is divided into a number of strip structures, and therefore the resistance of the NEMS device structure 100a is reduced due to the parallel connection. Furthermore, the NEMS device structure 100a has zero leakage.

Figure 2A:
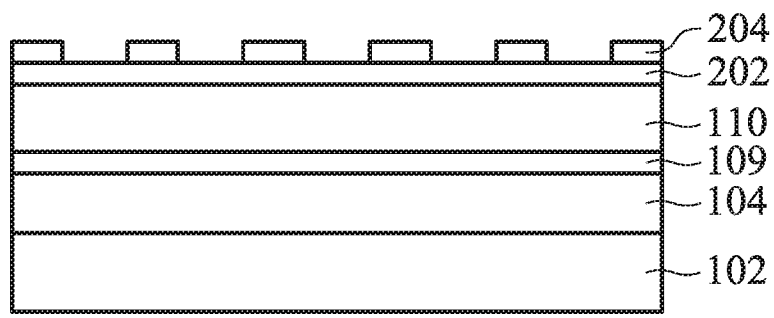
FIGS. 2A-2T show cross-sectional representations of various stages of forming a NEMS device structure, in accordance with some embodiments of the disclosure.
Figure 2B:
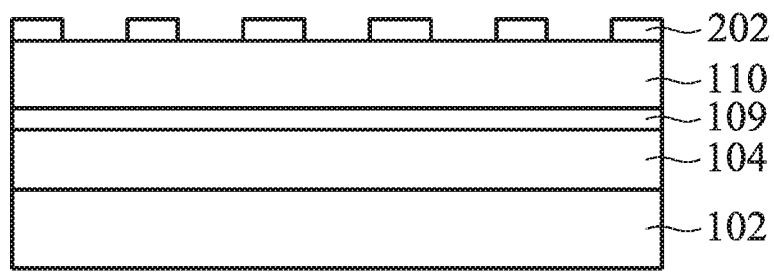
Figure 2C:
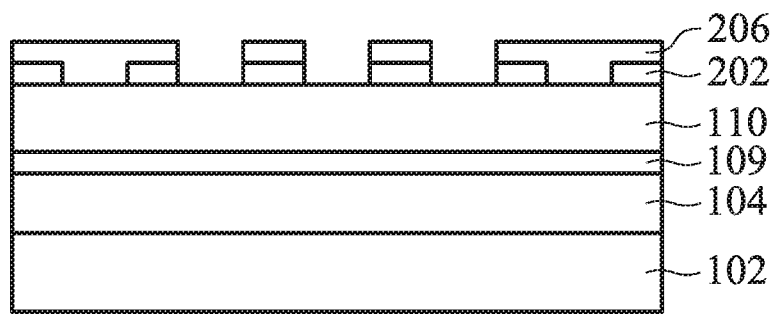
Figure 2D:
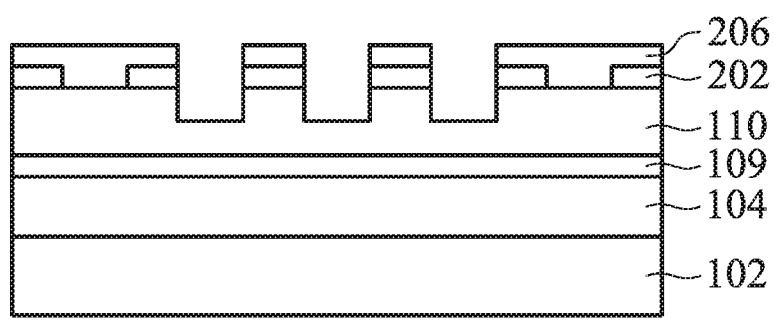
Figure 2E:
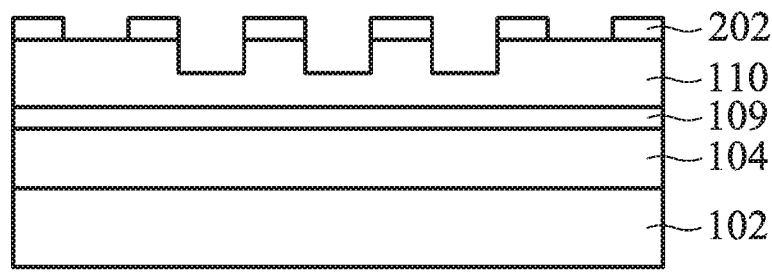
Figure 2F:
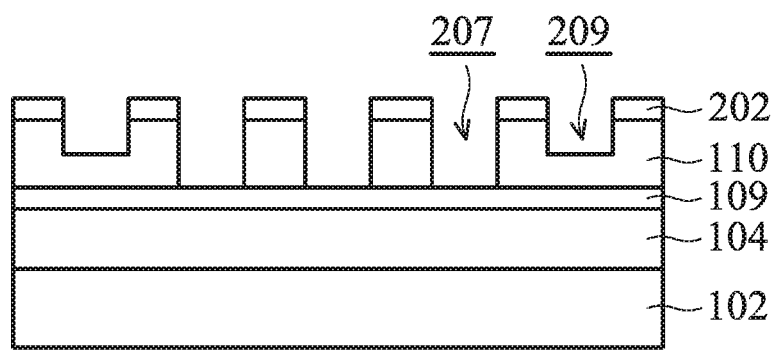
Figure 2G:
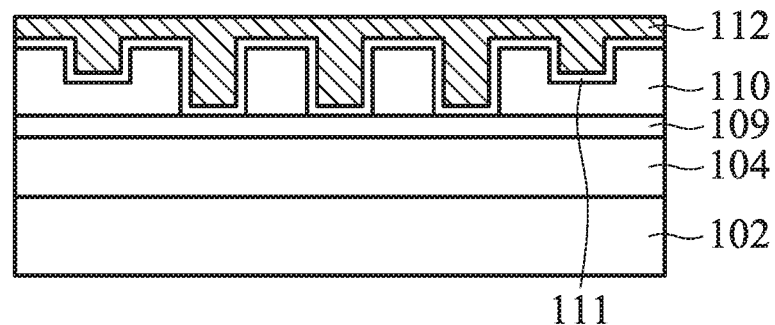
Figure 2H:
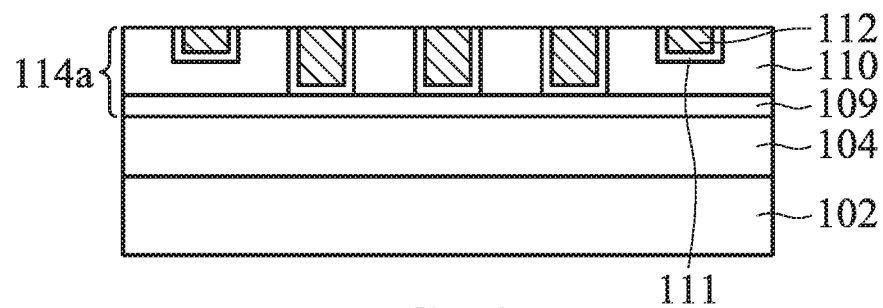
Figure 2I:
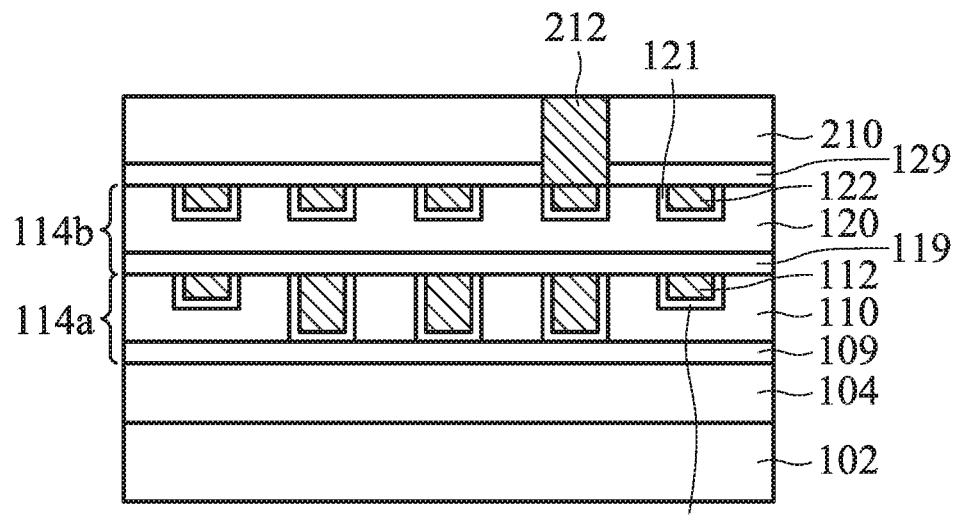
Figure 2J:
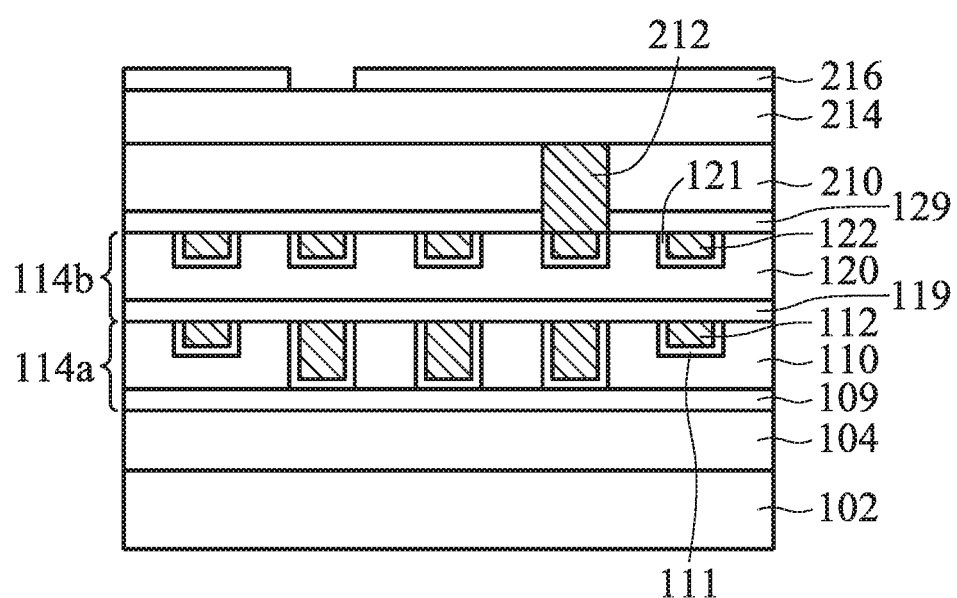
Figure 2K:
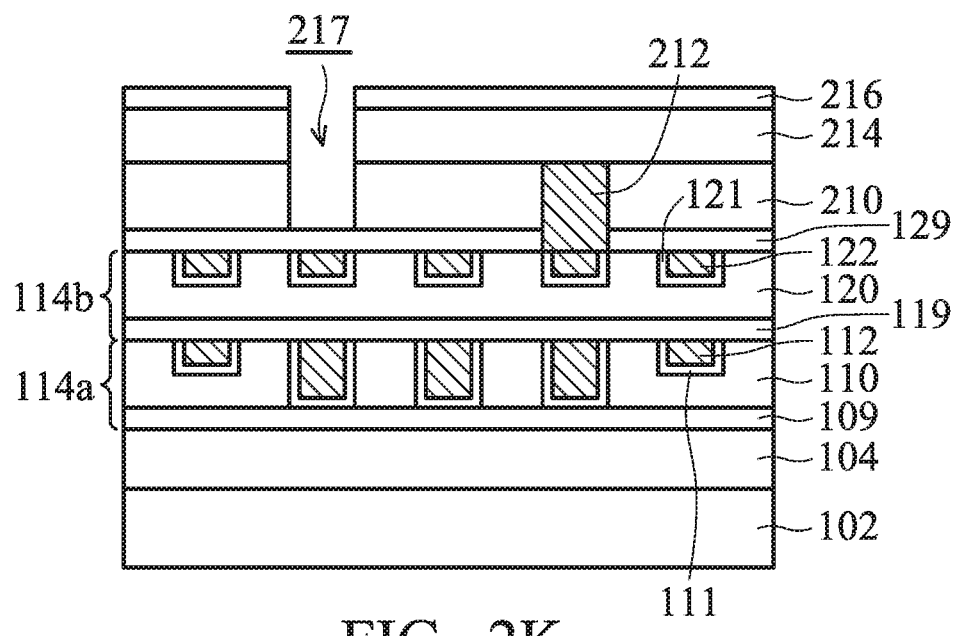
Figure 2L:
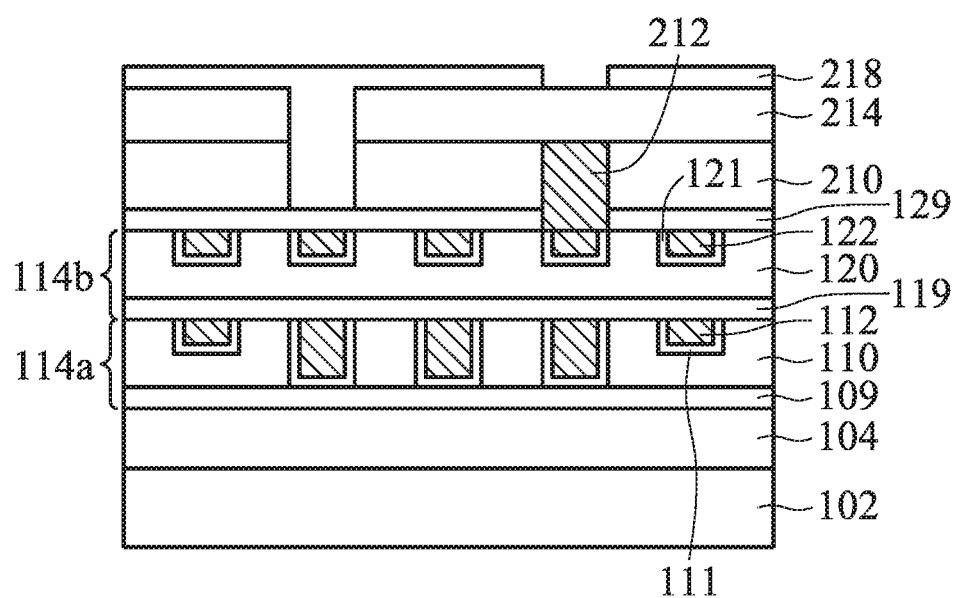
Figure 2M:
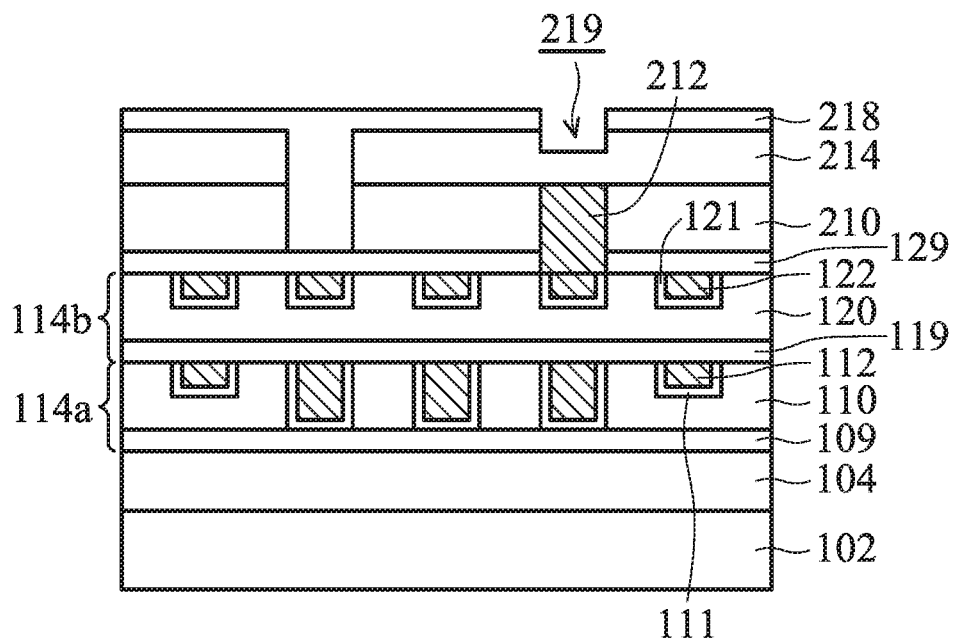
Figure 2N:
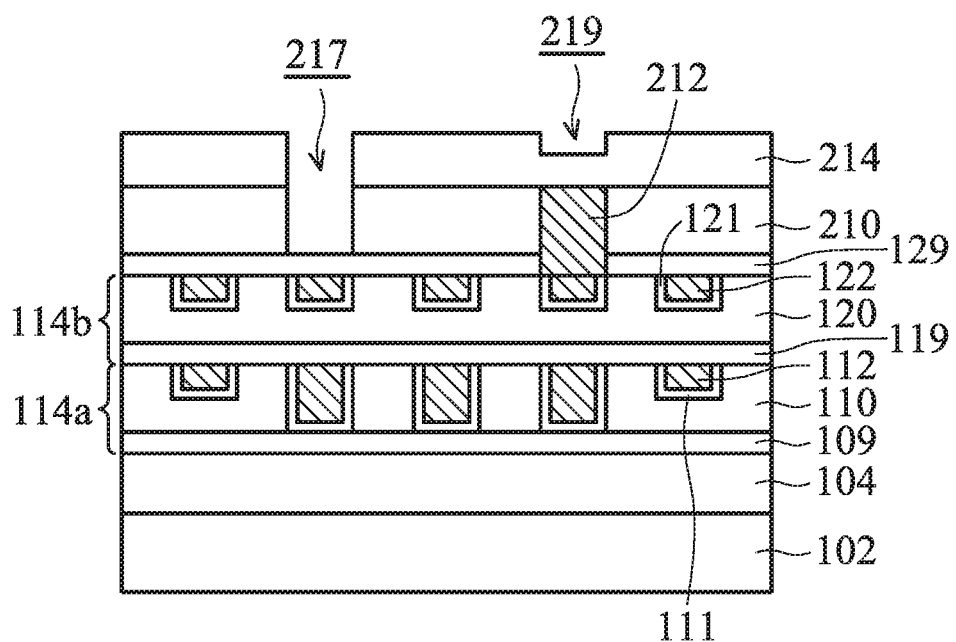
Figure 2O:
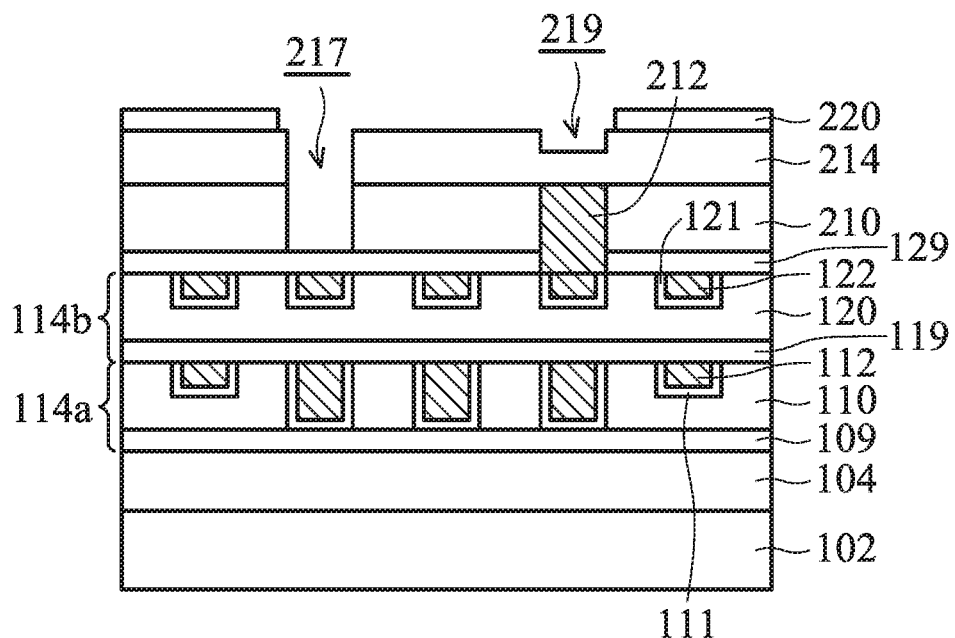
Figure 2P:
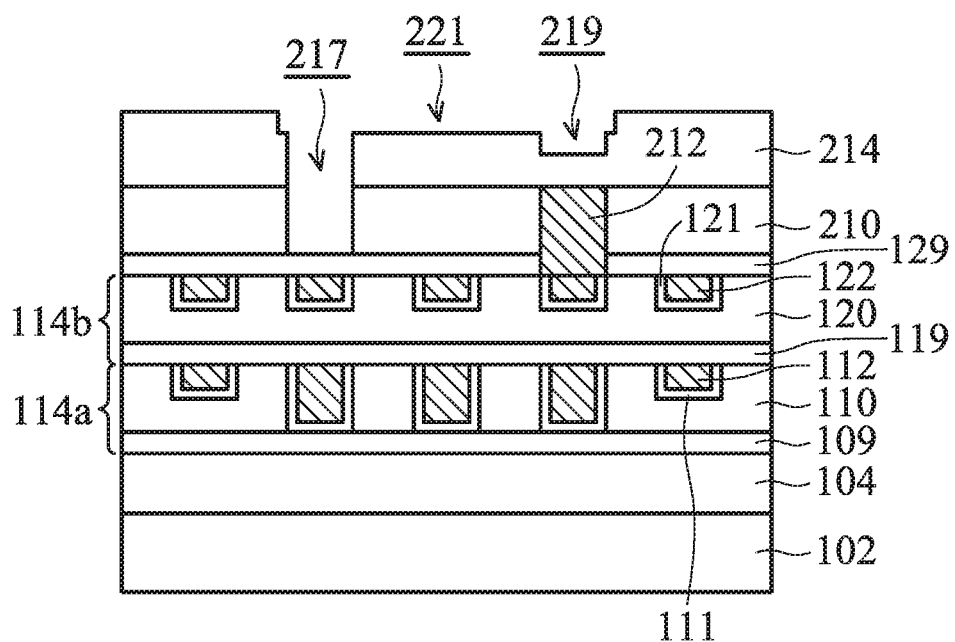
Figure 2Q:
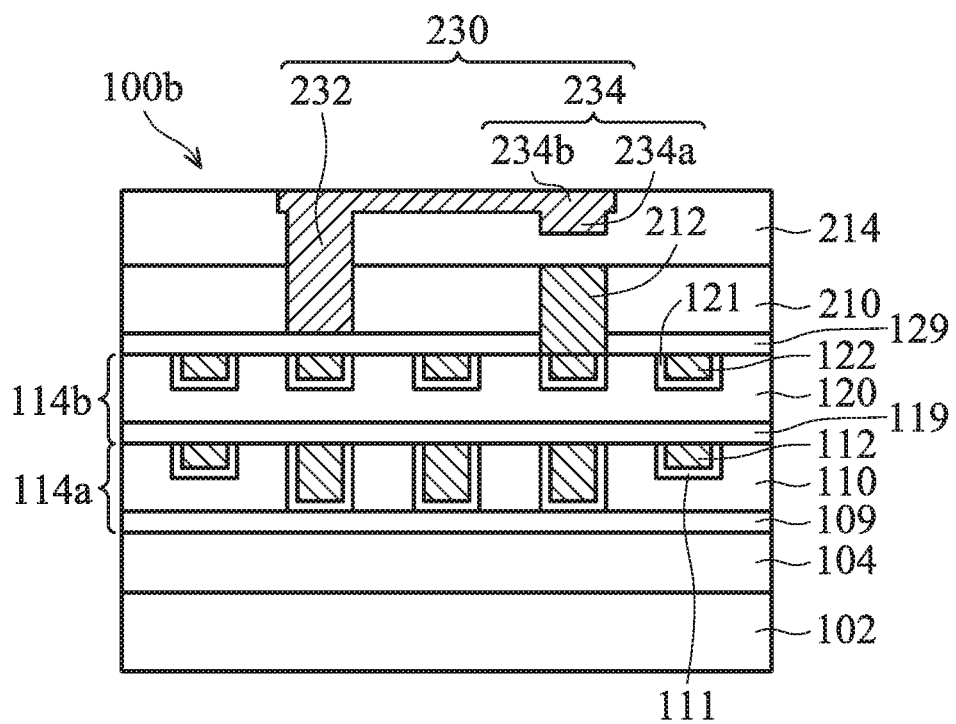
Figure 2R:
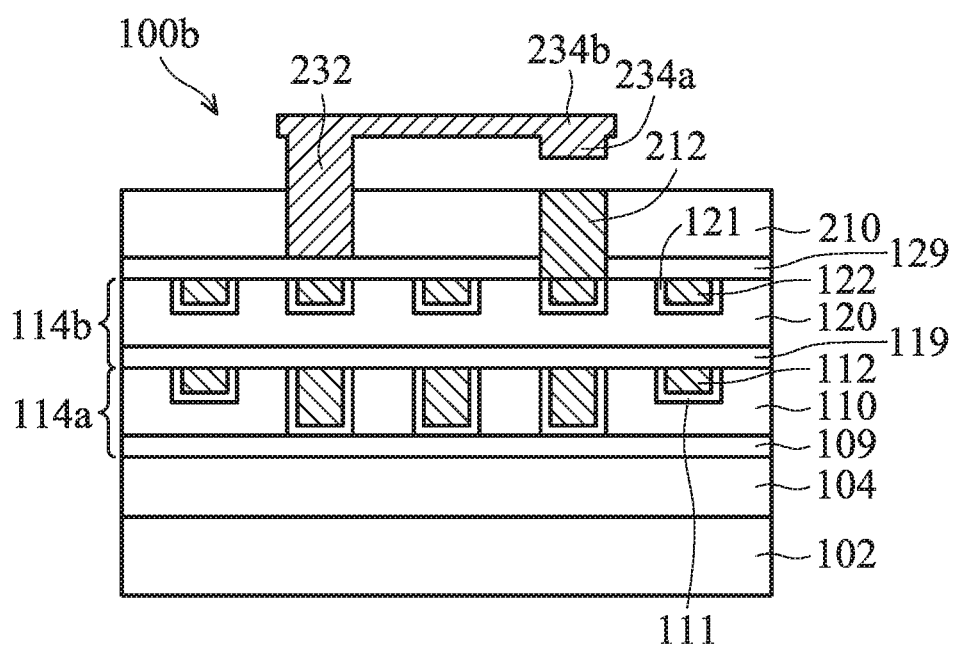
Figure 2S:
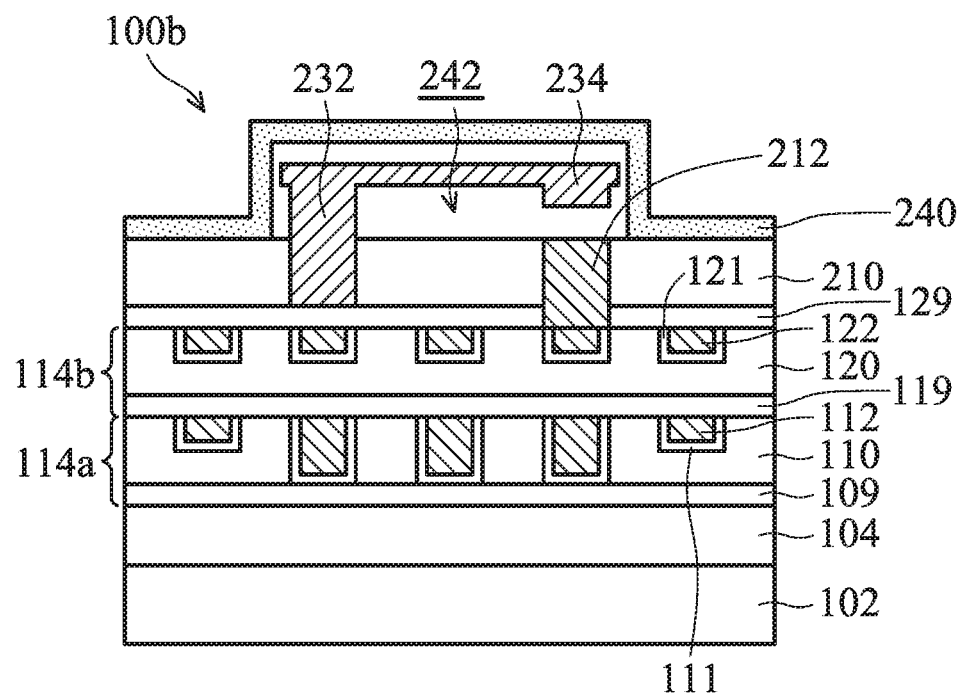
Figure 2T:
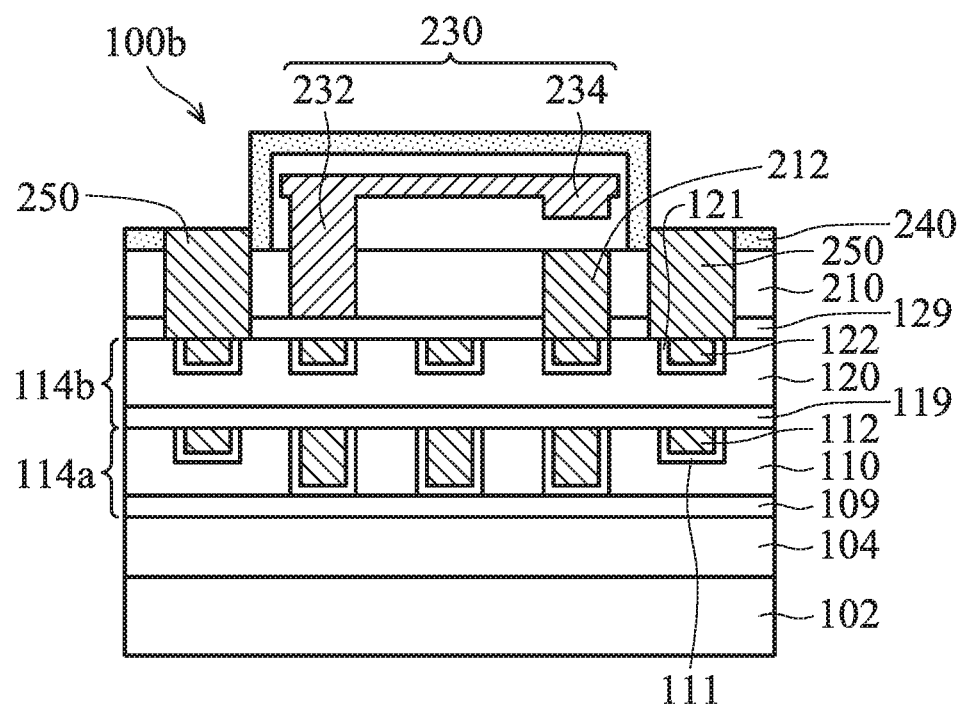

FIGS. 2A-2T show cross-sectional representations of various stages of forming a NEMS device structure 100b, in accordance with some embodiments of the disclosure. Processes and materials used to form the semiconductor device structure 100b may be similar to, or the same as, those used to form the semiconductor device structure 100a and are not repeated herein.

Referring to FIG. 2A, the substrate 102 is received. The inter-layer dielectric (ILD) layer 104 is formed over the substrate 102. In some embodiments, a device element (such as element 105 in FIG. 1A) is formed in the ILD layer 104. A first etching stop layer 109 is formed over the ILD layer 104. The first dielectric layer 110 is formed over the first etching stop layer 109. A hard mask layer 202 is formed over the first dielectric layer 110. A photoresist layer 204 is formed over the hard mask layer 202. The photoresist layer 204 is then patterned to form a patterned photoresist layer 204.

After the photoresist layer 204 is patterned, the hard mask layer 202 is patterned by using the patterned photoresist layer 204, as shown in FIG. 2B, in accordance with some embodiments of the disclosure.

Afterwards, a second photoresist layer 206 is formed and patterned over the hard mask layer 202, as shown in FIG. 2C, in accordance with some embodiments of the disclosure.

Afterwards, a portion of the first dielectric layer 110 is removed by using the patterned second photoresist layer 206 as a mask, as shown in FIG. 2D, in accordance with some embodiments of the disclosure.

Afterwards, the patterned second photoresist layer 206 is removed, as shown in FIG. 2E, in accordance with some embodiments of the disclosure.

Afterwards, a portion of the first dielectric layer 110 is removed by using the patterned hard mask layer 202 as a mask, as shown in FIG. 2F, in accordance with some embodiments of the disclosure. First trenches 207 and second trenches 209 are formed in the first dielectric layer 110. The depth of the first trenches 207 is greater than that of the second trenches 209. A portion of the first etching stop layer 109 is exposed by the first trenches 207.

Afterwards, a first diffusion barrier layer 111 and a first conductive layer 112 are sequentially formed in the first trenches 207 and the second trenches 209, as shown in FIG. 2G in accordance with some embodiments of the disclosure.

In some embodiments, the first diffusion barrier layer 111 is made of Ta, TaN, Ti, TiN, or CoW. In some embodiments, the first diffusion barrier layer 111 is formed by a physical vapor deposition (PVD) process or an atomic layer deposition (ALD) process. In some embodiments, the first conductive layer 112 is made of copper, copper alloy, aluminum, aluminum alloys, or a combination thereof. In some embodiments, the first conductive layer 112 is formed by plating.

Afterwards, a polishing process is performed on the first conductive layer 112, as shown in FIG. 2H, in accordance with some embodiments of the disclosure. A first interconnect structure 114a is constructed by the first etching stop layer 109, the first dielectric layer 110, the diffusion barrier layer 111 and the first conductive layer 112. The first dielectric layer 110, the diffusion barrier layer 111 and the first conductive layer 112 are formed in a back-end-of-line (BEOL) process.

Afterwards, a second etching stop layer 119 is formed over the first dielectric layer 110, and a second dielectric layer 120 is formed over the second etching stop layer 119, as shown in FIG. 2I, in accordance with some embodiments of the disclosure. In some embodiments, the first dielectric layer 110 and the second dielectric layer 120 are made of the same materials. In some embodiments, the second etching stop layer 119 is made of silicon carbide (SiC), silicon nitride (SixNy), silicon carbonitride (SiCN), silicon oxycarbide (SiOC), silicon oxycarbon nitride (SiOCN), tetraethoxysilane (TEOS) or another applicable material.

A second diffusion barrier layer 121 and the second conductive layer 122 are formed in the second dielectric layer 120. A second interconnect structure 114b is constructed by the second etching stop layer 119, the second dielectric layer 120, the second diffusion barrier layer 121, the second conductive layer 122. The second interconnect structure 114b is formed on the first interconnect structure 114a.

Afterwards, a third etching stop layer 129 is formed over the second dielectric layer 120. A third dielectric layer 210 is formed over the third etching stop layer 129, and a third conductive layer 212 is formed in the third dielectric layer 210 and the third etching stop layer 129. The third conductive layer 212 is electrically connected to the second conductive layer 122.

Afterwards, a sacrificial layer 214 is formed over the third dielectric layer 210 and the third conductive layer 212, as shown in FIG. 2J, in accordance with some embodiments of the disclosure. A third photoresist layer 216 is formed and patterned over the sacrificial layer 214.

After the third photoresist layer 216 is patterned, a portion of the sacrificial layer 214 and a portion of the third dielectric layer 210 are removed to form a third trench 217, as shown in FIG. 2K, in accordance with some embodiments of the disclosure. As a result, a portion of the third etching stop layer 129 is exposed by the third trench 217.

Afterwards, a fourth photoresist layer 218 is formed and patterned over the sacrificial layer 214, as shown in FIG. 2L, in accordance with some embodiments of the disclosure. In addition, the fourth photoresist layer 218 is filled in the third trench 217.

Afterwards, a portion of the sacrificial layer 214 is removed to form a fourth trench 219, as shown in FIG. 2M, in accordance with some embodiments of the disclosure.

Afterwards, the fourth photoresist layer 218 is removed, as shown in FIG. 2N, in accordance with some embodiments of the disclosure. As a result, the third trench 217 and the fourth trench 219 are obtained. The depth of the third trench 217 is greater than that of the fourth trench 219.

Afterwards, a fifth photoresist layer 220 is formed over the sacrificial layer 214, as shown in FIG. 2O, in accordance with some embodiments of the disclosure. Next, the fifth photoresist layer 220 is patterned to form a patterned fifth photoresist layer 220.

Afterwards, a portion of the sacrificial layer 214 is removed by using the patterned fifth photoresist layer 220 as a mask, as shown in FIG. 2P, in accordance with some embodiments of the disclosure. As a result, a fifth trench 221 connected to the third trench 217 and the fourth trench 219 is obtained.

Afterwards, a conductive material is filled into the third trench 217, the fourth trench 219 and the fifth trench 221 and over the sacrificial layer 214, as shown in FIG. 2Q, in accordance with some embodiments of the disclosure. Afterwards, a polishing process is performed to form the NEMS device structure 100b. In some embodiments, the polishing process is a chemical mechanical polishing (CMP) process.

The NEMS device structure 100b includes a beam structure 230 formed in and over the second dielectric layer 210. The beam structure 230 includes a fixed portion 232 and a moveable portion 234. The fixed portion 232 is extended vertically and has a T-like shape, and the moveable portion 234 is extended horizontally. The moveable portion 234 includes a protruding portion 234a and a main portion 234b.

Afterwards, the sacrificial layer 214 is removed, as shown in FIG. 2R, in accordance with some embodiments of the disclosure. The sacrificial layer 214 is removed by a wet process or a dry process. In some embodiments, the sacrificial layer 214 is removed by a liquid hydrogen-fluoride (HF) solution or a vapor HF.

Afterwards, a cap structure 240 formed over the NEMS device structure 110b, as shown in FIG. 2S, in accordance with some embodiments of the disclosure. A cavity 242 is formed between the NEMS device structure 110b and the cap structure 240. In some embodiments, the cap structure 240 is made of silicon oxide ($SiO_2$), silicon nitride, silicon carbide, or another applicable material.

The third conductive layer 212 is used as a sensing electrode and is aligned to the protruding portion 234a of the moveable portion 234 of the beam structure 230. When the NEMS device structure 100b is operated, the moveable portion 234a moves up and down, and the movement of the moveable portion 234a is detected by the sensing electrode (e.g. the third conductive layer 212).

Afterwards, a connector 250 is formed through the third dielectric layer 210 and the third etching stop layer 129, as shown in FIG. 2T, in accordance with some embodiments of the disclosure. The connector 250 is electrically connected to the second conductive layer 122.

The fabrication operations shown in FIGS. 2A-2M for forming the NEMS device structure 100b are integrated with the interconnect structure flow at BEOL. Therefore, compared with a comparative embodiment with a NEMS device structure formed at FEOL, the areas below the NEMS device structure 100b may be used for forming other logic devices. In addition, the beam structure may be divided into a number of strip structures, and therefore the resistance of the NEMS device structure 100b may be reduced due to the parallel connection. Furthermore, the NEMS device structure 100b has zero leakage.

FIGS. 3A-3E show cross-sectional representations of various stages of forming a NEMS device structure 100c, in accordance with some embodiments of the disclosure. Processes and materials used to form semiconductor device structure 100c may be similar to, or the same as, those used to form the semiconductor device structure 100b and are not repeated herein.

Figure 3A:
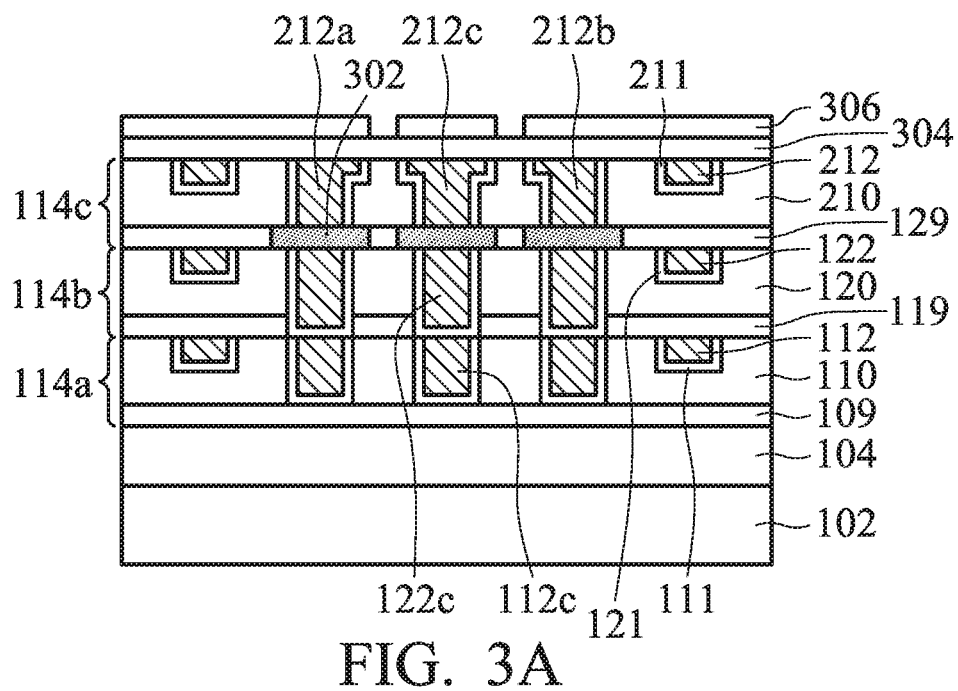
FIGS. 3A-3E show cross-sectional representations of various stages of forming a NEMS device structure, in accordance with some embodiments of the disclosure.

Referring to FIG. 3A, the substrate 102 is received. The inter-layer dielectric (ILD) layer 104 is formed over the substrate 102. In some embodiments, a device element (such as element 105 in FIG. 1A) is formed in the ILD layer 104. The first etching stop layer 109 is formed over the ILD layer 104. The first dielectric layer 110 is formed over the first etching stop layer 109.

The first diffusion barrier layer 111 and the first conductive layer 112 are formed in the first dielectric layer 110. The second etching stop layer 119 is formed over the first dielectric layer 110. The second dielectric layer 120 is formed over the second etching stop layer 119. The second diffusion barrier layer 121 and the second conductive layer 122 are formed in the second dielectric layer 120. A portion of the second conductive layer 122 is electrically connected to a portion of the first conductive layer 112. The third etching stop layer 129 is formed over the second dielectric layer 120.

The third dielectric layer 210 is formed over the third etching stop layer 129. The third diffusion layer 211 and the third conductive layer 212 are formed in the third dielectric layer 210. A fourth etching stop layer 304 is formed over the third dielectric layer 210, and a photoresist layer 306 is formed and patterned over the third etching stop layer 304. The interconnect structure includes three layers. The second interconnect structure 114b is formed over the first interconnect structure 114a, and the third interconnect structure 114c is formed over the second interconnect structure 114b.

It should be noted that an insulating layer 302 is formed between the second conductive layer 122 and the third conductive layer 212. Therefore, the second conductive layer 122 is insulated from the third conductive layer 212 by the insulating layer 302.

Furthermore, the third conductive layer 212 includes at least three portions. In some embodiments, the third conductive layer 212 includes a first portion 212a, a second portion 212b and a third portion 212c between the first portion 212a and the second portion 212b. The first portion 212a has an extending portion toward the sidewall of the third portion 212c, and the second portion 212b has an extending portion toward the sidewall of the third portion 212c. The shape of the first portion 212a and the shape of the second portion 212b are symmetrical relative to the third portion 212c.

Figure 3B:
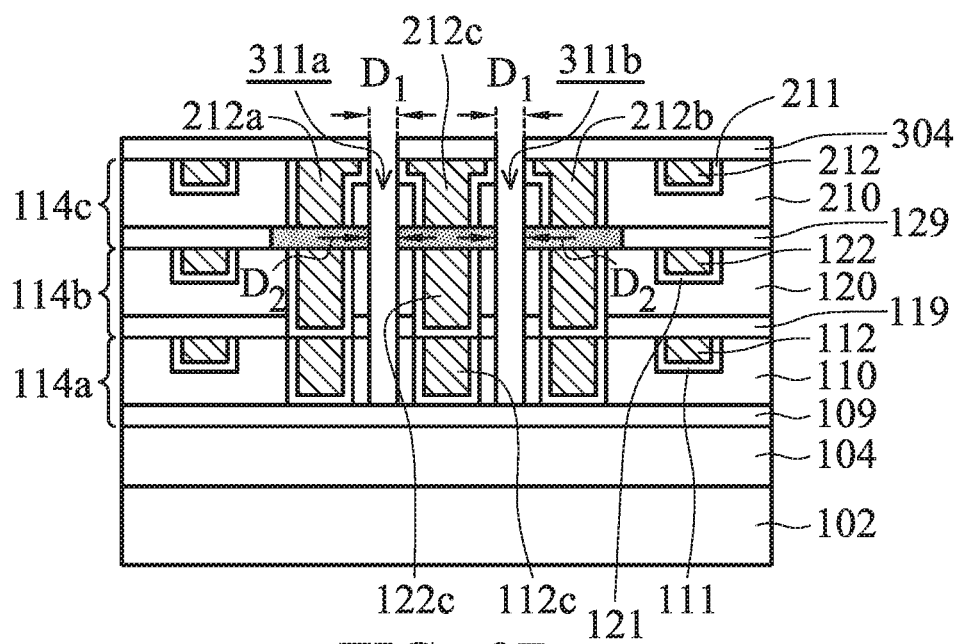

After the photoresist layer 306 is patterned, a portion of the fourth etching stop layer 304 is patterned by using the patterned photoresist layer 306 as a mask, as shown in FIG. 3B, in accordance with some embodiments of the disclosure. Afterwards, a portion of the third dielectric layer 210, a portion of the second dielectric layer 120, and a portion of the first dielectric layer 110 are removed to form a deep trench 311. In addition, a portion of the second etching stop layer 119 is removed. The deep trench 311 is formed by several etching operations. The deep trench 311 includes a first deep trench 311a and a second deep trench 311b. The first deep trench 311a is formed between the first portion 212a and the third portion 212c, and the second deep trench 311b is formed between the second portion 212b and the third portion 212c of the third conductive layer 212.

It should be noted that several interconnect structures are stacked vertically, and then a portion of the dielectric layers are etched by the etching process. Because the conductive layers are pre-aligned when they are stacked, the deep trench 311 will not pass through the conductive layer. The advantage of the fabrication sequence of this embodiment is that the deep trench alignment issue is resolved.

The deep trench 311 has a uniform width from top to bottom. The deep trench 311 has a first width $D_1$. The first width $D_1$ is equal to a distance $D_2$ between two adjacent insulating layers 302.

Figure 3C:
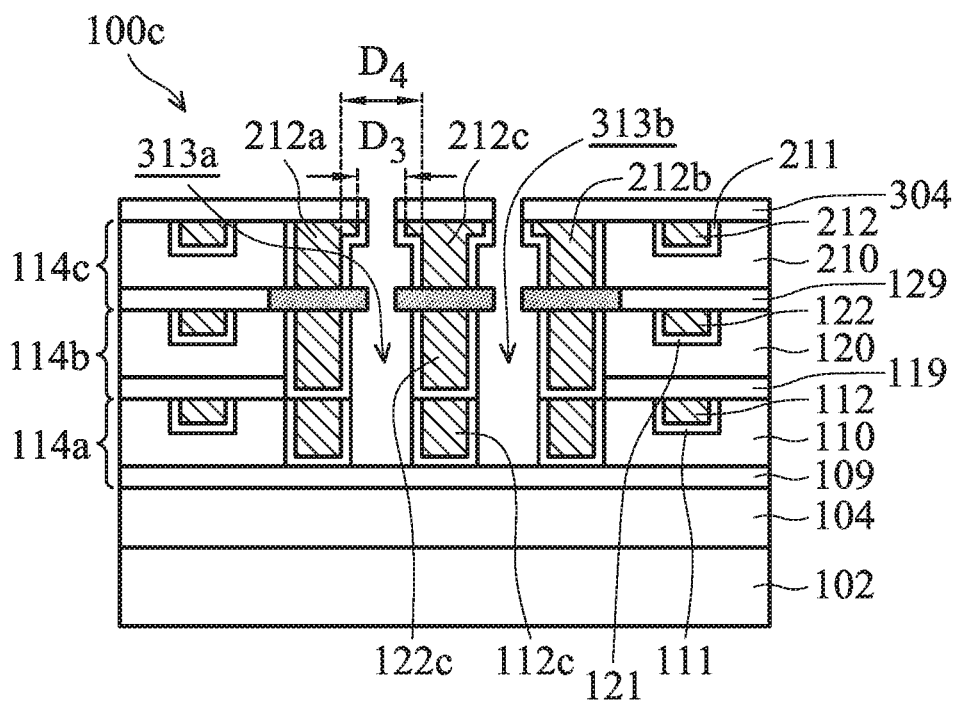

Afterwards, a portion of the third dielectric layer 210, a portion of the second dielectric layer 120, and a portion of the first dielectric layer 110 are removed to enlarge the width of the deep trench 311, as shown in FIG. 3C, in accordance with some embodiments of the disclosure. As a result, the deep trench 311 is enlarged to form a through hole 313. The through hole 313 includes a first through hole 313a and a second through hole 313b. The first through hole 313a is formed between the first portion 212a and the third portion 212c, and the second through hole 313b is formed between the second portion 212b and the third portion 212c of the third conductive layer 212.

It should be noted that the through hole 313 has a bottom surface and a top surface, and a top width of the top surface is smaller than a bottom width of the bottom surface. More specifically, a third width $D_3$ is a distance defined between a sidewall of the top portion of the first portion 212a and a sidewall of the top portion of the third portion 212c. A fourth width $D_4$ is a distance defined between a sidewall of the bottom portion of the first portion 212a and a sidewall of the bottom portion of the third portion 212c. The fourth width $D_4$ is greater than the third width $D_3$.

As shown in FIG. 3C, the NEMS device structure 100c includes the first portion 212a, the second portion 212b and the third portion 212c. The first portion 212a is configured as a first supporting electrode, the second portion 212b is configured as a second supporting electrode, and the third portion 212c is configured as a beam structure of the NEMS device structure 100c. When the NEMS device structure 100c is operated, the third portion 212c moves right and left, and the movement of the third portion 212c is detected by the first portion 212a and the second portion 212b.

Figure 3D:
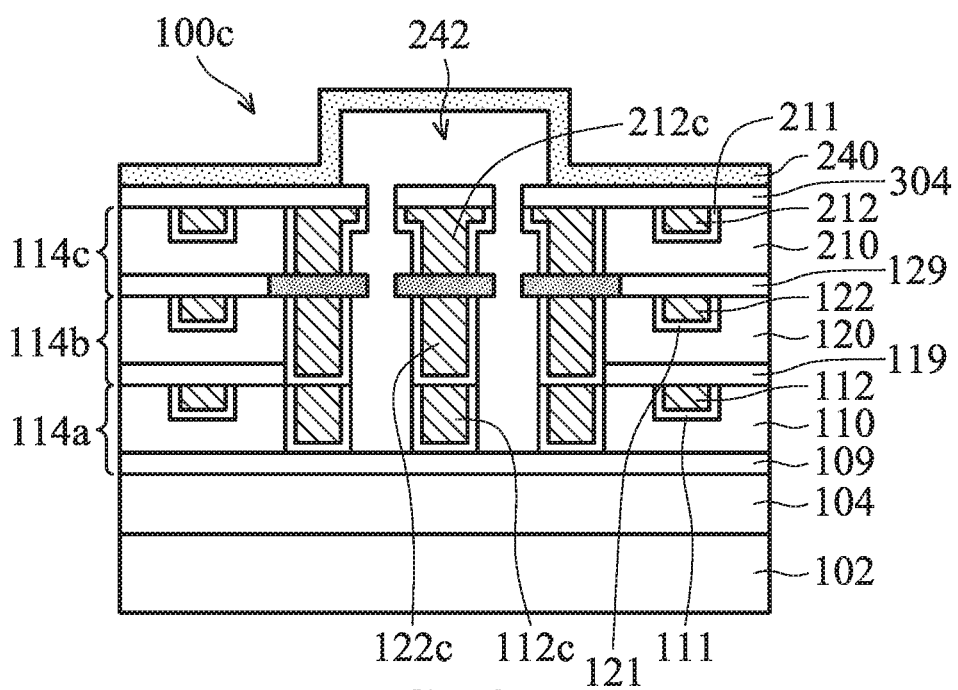

Afterwards, the cap structure 240 is formed over the NEMS device structure 100c, as shown in FIG. 3D, in accordance with some embodiments of the disclosure. The cavity 242 is formed between the cap structure 240 and the NEMS device structure 100c.

Figure 3E:
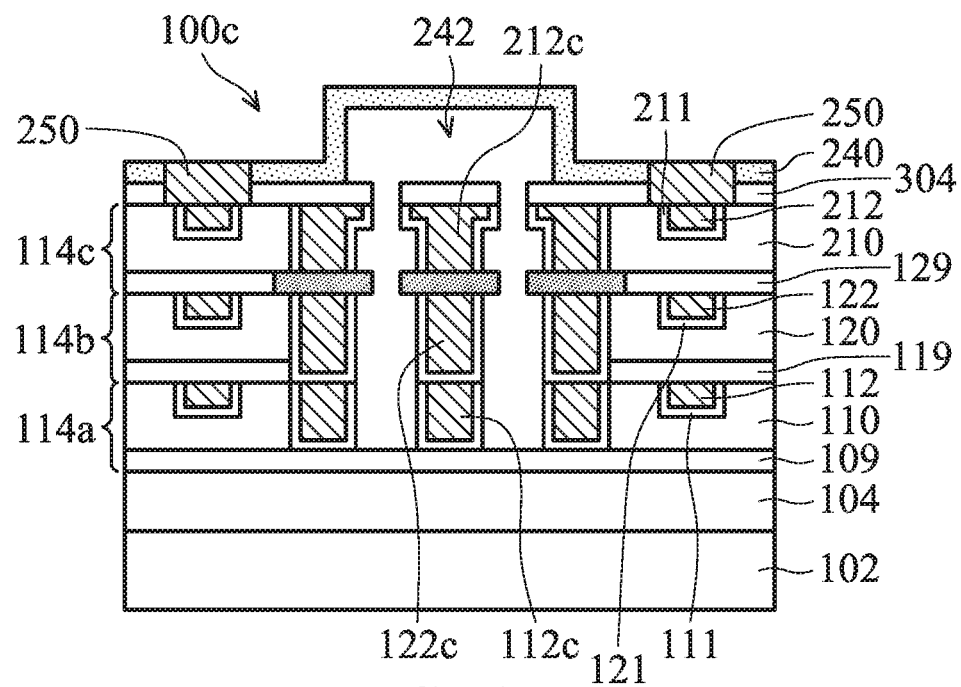
Figure 3E:
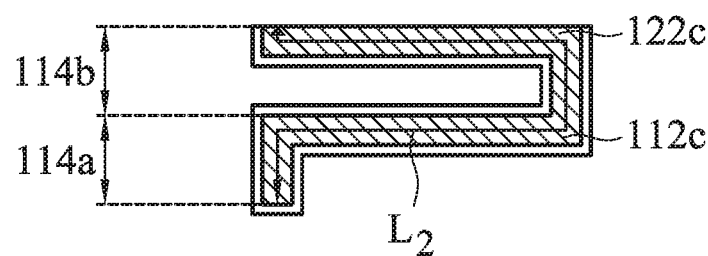

Afterwards, the connector 250 is formed through the second dielectric layer 210 and the third etching stop layer 129, as shown in FIG. 3E, in accordance with some embodiments of the disclosure. The connector 250 is electrically connected to a portion of the third conductive layer 212.

FIG. 3E' shows a perspective view of the conductive layers 112c, 122c and 212c of FIG. 3E, in accordance with some embodiments of the disclosure. As shown in FIG. 3E', the third portion 112c of the first conductive layer 112 at the first interconnect structure 114a is connected to the third portion 122c of the second conductive layer 122 at the second interconnect structure 114b. The third portion 122c of the second conductive layer 122 at the second interconnect structure 114b is isolated to the third portion 212c of the third conductive layer 212. Therefore, the beam length $L_2$ of the beam structure is the sum of the length of the third portion 112c and the length of third portion 122c. In some embodiments, the beam length $L_2$ of the beam structure of the NEMS device structure 100c is in a range from about 10 um to about 20 um (micrometer). When the beam length $L_2$ is within the above-mentioned range, the operation voltage (pull-in voltage) is relatively lower to meet requirements.

The fabrication operations shown in FIGS. 3A-3E for forming the NEMS device structure 100c are integrated with the interconnect structure flow at BEOL. Therefore, the NEMS device structure is formed at BEOL, and the areas below the NEMS device structure 100c may be used for forming other logic devices. In addition, the operation voltage (pull-in voltage) of the NEMS device structure is relatively lower by adjusting the length of the beam structure.

Embodiments for a NEMS device structure and method for formation the same are provided. The NEMS device structures are formed at back-end-of-line (BEOL) process. The fabrication operations for forming the NEMS device structure are integrated with the interconnect structure flow. In addition, the areas which are adjacent to a transistor and below the NEMS device structure may be saved and be used as another logic device. Furthermore, the beam structure of the NEMS device structure is divided into several strip structures, and therefore the resistance of the NEMS device structure is reduced.

In some embodiments, a NEMS device structure is provided. The NEMS device structure includes a substrate and an interconnect structure formed over the substrate. The NEMS device structure includes a dielectric layer formed over the interconnect structure and a beam structure formed in and over the dielectric layer, wherein the beam structure includes a plurality of strip structures. The NEMS device structure includes a cap structure formed over the dielectric layer and the beam structure and a cavity formed between the beam structure and the cap structure.

In some embodiments, a NEMS device structure is provided. The NEMS device structure includes an interconnect structure formed over a substrate and a dielectric layer formed over the interconnect structure. The NEMS device structure includes a beam structure formed in and over the dielectric layer, and the beam structure includes a fixed portion and a moveable portion, the fixed portion is extended vertically, and the movable portion is extended horizontally. The NEMS device structure includes a cap structure formed over the dielectric layer and the beam structure and a cavity formed between the beam structure and the cap structure.

In some embodiments, a NEMS device structure is provided. The NEMS device structure includes a first dielectric layer formed over a substrate and a first conductive layer formed in a first dielectric layer. The first conductive layer includes a first portion, a second portion, and a third portion between the first portion and the second portion. The NEMS device structure includes a second dielectric layer formed over the first dielectric layer and a first supporting electrode, a second supporting electrode and a beam structure formed in the second dielectric layer. The beam structure is formed between the first supporting electrode and the second supporting electrode, and the beam structure is aligned to the third portion of the first conductive layer. The NEMS device structure includes a first through hole formed between the first supporting electrode and the beam structure and a second through hole formed between the second supporting electrode and the beam structure.

In some embodiments, a NEMS device structure is provided. The NEMS device structure includes a first dielectric layer formed over a substrate, and a first conductive layer formed in the first dielectric layer. The first conductive layer comprises a first portion, a second portion, and a third portion between the first portion and the second portion. The NEMS device structure includes a second dielectric layer formed over the first dielectric layer, and a first supporting electrode, a second supporting electrode and a beam structure formed in the second dielectric layer. The first supporting electrode is directly above the first portion of the first conductive layer, the second supporting electrode is directly above the second portion of the first conductive layer, the beam structure is directly above the third portion of the first conductive layer, the beam structure is spaced from the first supporting electrode and the second supporting electrode. The NEMS device structure includes a cap structure formed over the beam structure, and a cavity formed between the beam structure and the cap structure.

In some embodiments, a NEMS device structure is provided. The NEMS device structure includes a first dielectric layer formed over a substrate, and a first conductive layer formed in the first dielectric layer. The NEMS device structure includes a second dielectric layer formed over the first dielectric layer, and a first supporting electrode a second supporting electrode and a beam structure formed in the second dielectric layer. The beam structure is formed between the first supporting electrode and the second supporting electrode, and the beam structure has a T-shaped structure. The NEMS device structure includes a first through hole formed between the first supporting electrode and the beam structure, and a second through hole formed between the second supporting electrode and the beam structure.

In some embodiments, a NEMS device structure is provided. The NEMS device structure includes a first dielectric layer formed over a substrate, and a first conductive layer formed in the first dielectric layer. The first conductive layer includes a first portion, a second portion, and a third portion between the first portion and the second portion. The NEMS device structure includes a second dielectric layer formed over the first dielectric layer, and a first supporting electrode, a second supporting electrode and a beam structure formed in the second dielectric layer. The beam structure is formed between the first supporting electrode and the second supporting electrode, and a sidewall of the beam structure is aligned to a sidewall of the third portion of the first conductive layer. The NEMS device structure includes a first through hole formed between the first supporting electrode and the beam structure, and a second through hole formed between the second supporting electrode and the beam structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A nano-electromechanical system (NEMS) device structure, comprising:
    a first dielectric layer formed over a substrate;
    a first conductive layer formed in the first dielectric layer, wherein the first conductive layer comprises a first portion, a second portion, and a third portion between the first portion and the second portion;
    a second dielectric layer formed over the first dielectric layer;
    a first supporting electrode, a second supporting electrode and a beam structure formed in the second dielectric layer, wherein the first supporting electrode is directly above the first portion of the first conductive layer, the second supporting electrode is directly above the second portion of the first conductive layer, the beam structure is directly above the third portion of the first conductive layer, the beam structure is spaced from the first supporting electrode and the second supporting electrode;
    a cap structure formed over the beam structure;
    a cavity formed between the beam structure and the cap structure;
    an insulating layer between the third portion of the conductive layer and the beam structure, wherein the insulating layer is in direct contact with the third portion of the conductive layer; and first etching stop layer between the beam structure and the cap structure, wherein the first etching stop layer has a topmost surface and a bottommost surface, the topmost surface is closer to the cap structure than the bottommost surface, and the bottommost surface of the first etching stop layer is between a topmost surface of the beam structure and the cap structure.

2. The NEMS device structure as claimed in claim 1, further comprising:
a first through hole formed between the first supporting electrode and the beam structure; and
a second through hole formed between the second supporting electrode and the beam structure.

3. The NEMS device structure as claimed in claim 2, wherein the first through hole is connecting the cavity.

4. The NEMS device structure as claimed in claim 1, further comprising:
a second etching stop layer between the first dielectric layer and the second dielectric layer, wherein the insulating layer is in direct contact with the second etching stop layer.

5. The NEMS device structure as claimed in claim 1, wherein the beam structure comprises a top surface and a bottom surface, wherein a top width of the top surface is greater than a bottom width of the bottom surface.

6. The NEMS device structure as claimed in claim 1, wherein a first distance is defined between a sidewall of a top portion of the first supporting electrode and a sidewall of a top portion of the beam structure, and a second distance is defined between a sidewall of a bottom portion of the first supporting electrode and a sidewall of a bottom portion of the beam structure, and the second distance is greater than the first distance.

7. The NEMS device structure as claimed in claim 1, further comprising:
a diffusion barrier layer surrounding the beam structure.

8. The NEMS device structure as claimed in claim 1, wherein the beam structure comprises a bottom surface, wherein a bottom width of the bottom surface is smaller than a width of the insulating layer.

9. The NEMS device structure as claimed in claim 1, wherein the beam structure has a T-shaped structure.

10. A nano-electromechanical system (NEMS) device structure, comprising:
a first dielectric layer formed over a substrate;
a first conductive layer formed in the first dielectric layer;
a second dielectric layer formed over the first dielectric layer;
a first supporting electrode, a second supporting electrode and a beam structure formed in the second dielectric layer, wherein the beam structure is formed between the first supporting electrode and the second supporting electrode, and the beam structure has a T-shaped structure;
a first through hole formed between the first supporting electrode and the beam structure;
a second through hole formed between the second supporting electrode and the beam structure; and
an etching stop layer over the beam structure, wherein a width of the etching stop layer is greater than a width of a bottom surface of the beam structure.

11. The NEMS device structure as claimed in claim 10, wherein the first conductive layer comprises a first portion, a second portion, and a third portion between the first portion and the second portion, and the beam structure is directly over the third portion of the first conductive layer.

12. The NEMS device structure as claimed in claim 11, further comprising:
an insulating layer between the third portion of the conductive layer and the beam structure.

13. The NEMS device structure as claimed in claim 10, further comprising:
a cap structure formed over the beam structure; and
a cavity formed between the beam structure and the cap structure, wherein the cavity is connected to the first through hole.

14. The NEMS device structure as claimed in claim 10, wherein a first distance is defined between a sidewall of a top portion of the first supporting electrode and a sidewall of a top portion of the beam structure, and a second distance is defined between a sidewall of a bottom portion of the first supporting electrode and a sidewall of a bottom portion of the beam structure, and the second distance is greater than the first distance.

15. A nano-electromechanical system (NEMS) device structure, comprising:
a first dielectric layer formed over a substrate;
a first conductive layer formed in the first dielectric layer, wherein the first conductive layer comprises a first portion, a second portion, and a third portion between the first portion and the second portion;
a second dielectric layer formed over the first dielectric layer;
a first supporting electrode, a second supporting electrode and a beam structure formed in the second dielectric layer, wherein the beam structure is formed between the first supporting electrode and the second supporting electrode, and a sidewall of the beam structure is aligned to a sidewall of the third portion of the first conductive layer;
a first through hole formed between the first supporting electrode and the beam structure;
a second through hole formed between the second supporting electrode and the beam structure; and
a diffusion barrier layer surrounding the beam structure, wherein the diffusion barrier layer has a step-shaped structure.

16. The NEMS device structure as claimed in claim 15, further comprising:
a cap structure formed over the beam structure; and
a cavity formed between the beam structure and the cap structure.

17. The NEMS device structure as claimed in claim 15, further comprising:
an insulating layer between the third portion of the conductive layer and the beam structure.

18. The NEMS device structure as claimed in claim 17, further comprising:
an etching stop layer between the first dielectric layer and the second dielectric layer, wherein the insulating layer is in direct contact with the etching stop layer.

19. The NEMS device structure as claimed in claim 15, wherein the beam structure comprises a top surface and a bottom surface, wherein a top width of the top surface is greater than a bottom width of the bottom surface.

20. The NEMS device structure as claimed in claim 15, wherein a first distance is defined between a sidewall of a top portion of the first supporting electrode and a sidewall of a top portion of the beam structure, and a second distance is defined between a sidewall of a bottom portion of the first supporting electrode and a sidewall of a bottom portion of the beam structure, and the second distance is greater than the first distance.

\* \* \* \* \*